(12) United States Patent
Ahuja et al.

(10) Patent No.: US 9,546,883 B2
(45) Date of Patent: Jan. 17, 2017

(54) SENSOR AUTO-CALIBRATION

(71) Applicant: QUALCOMM Incorporated, San Diego, CA (US)

(72) Inventors: Disha Ahuja, Campbell, CA (US); Victor Kulik, San Jose, CA (US); Carlos M. Puig, Santa Clara, CA (US); Ashish Nagesh Desai, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 1011 days.

(21) Appl. No.: 13/673,962

(22) Filed: Nov. 9, 2012

(65) Prior Publication Data

US 2013/0121367 A1 May 16, 2013

Related U.S. Application Data

(60) Provisional application No. 61/559,030, filed on Nov. 11, 2011.

(51) Int. Cl.
*G01C 25/00* (2006.01)
*G01K 15/00* (2006.01)
(Continued)

(52) U.S. Cl.
CPC ............ *G01C 25/00* (2013.01); *G01K 15/00* (2013.01); *G01P 21/00* (2013.01); *G01R 35/00* (2013.01);
(Continued)

(58) Field of Classification Search
USPC ....................................... 702/104
See application file for complete search history.

(56) References Cited

U.S. PATENT DOCUMENTS

| 4,777,416 A | 10/1988 | George, Ii et al. |
| 5,390,122 A | 2/1995 | Michaels et al. |

(Continued)

FOREIGN PATENT DOCUMENTS

| CN | 1813465 A | 8/2006 |
| EP | 2495573 A1 | 9/2012 |

(Continued)

OTHER PUBLICATIONS

International Search Report and Written Opinion—PCT/US2012/064710—ISA/EPO—Sep. 26, 2013.
(Continued)

*Primary Examiner* — Paul D Lee
(74) *Attorney, Agent, or Firm* — Kilpatrick Townsend & Stockton LLP

(57) ABSTRACT

Aspects of the disclosure relate to computing technologies. In particular, aspects of the disclosure relate to mobile computing device technologies, such as systems, methods, apparatuses, and computer-readable media for improving calibration data by increasing the diversity of orientations used for generating the calibration data. In one embodiment, the computing device receives a plurality of calibration measurements associated with one or more sensors of a device, determines a degree to which the plurality of calibration measurements were captured at different orientations of the device, and determines, based on the degree, whether to update one or more calibration parameters.

31 Claims, 21 Drawing Sheets

(51) Int. Cl.
*G01R 35/00* (2006.01)
*G06F 15/00* (2006.01)
*G01P 21/00* (2006.01)
*G06F 19/00* (2011.01)
*G06F 1/32* (2006.01)

(52) U.S. Cl.
CPC .............. *G06F 1/3206* (2013.01); *G06F 1/329* (2013.01); *G06F 15/00* (2013.01); *G06F 19/00* (2013.01); *Y02B 60/144* (2013.01)

(56) References Cited

U.S. PATENT DOCUMENTS

| | | | |
|---|---|---|---|
| 5,880,680 | A | 3/1999 | Wisehart et al. |
| 6,043,648 | A | 3/2000 | Menke et al. |
| 6,175,807 | B1 | 1/2001 | Buchler et al. |
| 6,577,952 | B2 | 6/2003 | Geier et al. |
| 6,708,279 | B1 | 3/2004 | Takenaka |
| 7,418,860 | B2 | 9/2008 | Austerlitz et al. |
| 7,725,253 | B2 | 5/2010 | Foxlin |
| 8,149,126 | B2 | 4/2012 | Little et al. |
| 8,528,381 | B2 * | 9/2013 | Rodney .......................... 73/1.75 |
| 2008/0236241 | A1 | 10/2008 | Ino |
| 2009/0036747 | A1 | 2/2009 | Hayter et al. |
| 2009/0164823 | A1 | 6/2009 | Aaltonen et al. |
| 2009/0259424 | A1 * | 10/2009 | Dutta ..................... G01C 17/28 702/85 |
| 2009/0273340 | A1 | 11/2009 | Stephanson et al. |
| 2010/0244945 | A1 | 9/2010 | Hahn et al. |
| 2011/0248704 | A1 | 10/2011 | Chowdhary et al. |
| 2011/0267120 | A1 * | 11/2011 | Ravi ..................... H03L 7/1978 327/159 |
| 2012/0087688 | A1 | 4/2012 | Kubota |
| 2012/0096921 | A1 | 4/2012 | Almalki et al. |
| 2012/0098525 | A1 | 4/2012 | Snow et al. |
| 2012/0173185 | A1 | 7/2012 | Taylor et al. |
| 2013/0124126 | A1 | 5/2013 | Ahuja et al. |
| 2013/0124127 | A1 | 5/2013 | Ahuja et al. |

FOREIGN PATENT DOCUMENTS

| | | |
|---|---|---|
| JP | 2005242717 A | 9/2005 |
| JP | 2006119916 A | 5/2006 |
| JP | 2009077021 A | 4/2009 |
| JP | 2011180383 A | 9/2011 |
| KR | 20060032150 A | 4/2006 |
| WO | 2004041086 A1 | 5/2004 |

OTHER PUBLICATIONS

Invitation to Pay additional fees for International Application No. PCT/US2012/064710, dated Mar. 8, 2013.

European Search Report—EP15201939—Search Authority—Munich—Mar. 31, 2016.

* cited by examiner

SENSOR AUTO-CALIBRATION

CROSS-REFERENCE TO RELATED APPLICATIONS

This patent application claims the benefit of U.S. Provisional Patent Application No. 61/559,030, filed Nov. 11, 2011, entitled "ACCELEROMETER AUTO-CALIBRATION," all of which is incorporated by reference herein in its entirety for all purposes.

BACKGROUND

Aspects of the disclosure relate to computing technologies. In particular, aspects of the disclosure relate to mobile computing device technologies, such as systems, methods, apparatuses, and computer-readable media that automatically calibrate one or more accelerometers and/or one or more other sensors, such as motion sensors, magnetometers, gyroscopes, and/or the like.

Increasingly, computing devices, such as smart phones, tablet computers, personal digital assistants (PDAs), and other mobile devices, include accelerometers and/or other motion sensors that may allow these devices to capture motion and/or other sensed conditions as a form of user input. As the inclusion of accelerometers and/or other motion sensors in computing devices becomes more common, the ways in which the computing devices process and/or otherwise use the motion information provided by such accelerometers and/or other motion sensors likewise becomes more sophisticated. Aspects of the disclosure provide more convenient and effective ways of enhancing how the information provided by accelerometers and/or other motion sensors can be interpreted and/or otherwise processed by a computing device, for instance, by providing ways of automatically calibrating accelerometers and/or other motion sensors.

BRIEF SUMMARY

According to one or more aspects of the disclosure, a computing device may automatically capture sensor measurements in response to detecting a passive calibration action. Subsequently, the computing device may store information about a position at which the sensor measurements were captured. Thereafter, the computing device may update one or more calibration parameters based on the automatically captured sensor measurements and the stored information.

Embodiments of the invention describe techniques for scheduling an execution of a task, such as a non-real time background task on a computing device. In one implementation, the technique includes detecting a first state of a device, wherein the first state of the device is associated with a first power level and a first task, determining that the first power level associated with the first state is above a threshold, and in response to determining that the first power level associated with the first state is above the threshold, and scheduling an execution of a second task on the device. It may be advantageous to execute the non-real time, non-latency sensitive background task while the device is in a high power state, to avoid consuming power and keeping the device in an elevated power state when no other tasks are running. The power state of the device may be determined by measuring the consumed power, detecting the state of the computing device, detecting the power state of the device using hardware mechanisms or by any other suitable means. Collecting calibration data on the computing device is an example of a non-real time background task. In one embodiment, the computing device may schedule the collection of calibration data for motion sensors while the device is already in an active state, thus efficiently utilizing power.

Another embodiment of the invention describes techniques for improving the calibration data by increasing the diversity of orientations used for generating calibration data. In one embodiment, the computing device receives a plurality of calibration measurements, determines a degree to which the plurality of calibration measurements were captured at different orientations, and determines, based on the degree, whether to update one or more calibration parameters. In one implementation, determining the degree to which the plurality of calibration measurements were captured at different orientations comprises calculating an orientation entropy value for the plurality of measurements.

In yet another embodiment, techniques are described herein to improve the calibration data by taking into account the effects of change in temperature on motion sensors. For instance, different levels of error may be associated with a motion sensor at different temperature levels. In one implementation, the calibration data associated with the various orientations at a temperature is used to determine the calibration data for that temperature. In this embodiment, the computing device may detect the temperature of an operating environment for a sensor coupled to a computing device, may determine that an entropy/diversity associated with the stored measurement data at or near the temperature is below a threshold, in response to determining that the entropy associated with the stored calibration data for the temperature is below a threshold, interpolate calibration data for an at least one orientation at the detected temperature using calibration data for the at least one orientation from another temperature, and generate calibration data for the sensor for the detected temperature using at least the interpolated calibration data.

An exemplary method for performing embodiments of the invention includes receiving a plurality of calibration measurements associated with one or more sensors of a device, determining a degree to which the plurality of calibration measurements were obtained at different orientations of the device, and determining, based on the degree, whether to update one or more calibration parameters. The sensors may be one or more of an accelerometer, a gyroscope or a magnetometer. In one implementation, determining the degree to which the plurality of calibration measurements were obtained at different orientations may comprise calculating an orientation entropy for the plurality of calibration measurements. The method may further comprise updating the one or more calibration parameters in response to determining that the orientation entropy exceeds a predetermined threshold. In one aspect, in response to determining that the orientation entropy is below a predetermined threshold, the method discards a calibration measurement for an orientation for which a calibration measurement has been previously received without updating the one or more calibration parameters. In another aspect, in response to determining that the orientation entropy is below a predetermined threshold, the method may use a calibration measurement for an orientation for which a calibration measurement has been previously received without updating the one or more calibration parameters. In another implementation, determining the degree to which the plurality of calibration measurements were obtained at different orientations is based at least in part on a histogram for the plurality of calibration measurements.

In one implementation of the method, determining the degree to which the plurality of calibration measurements were obtained at different orientations may comprise binning each of the plurality of calibration measurements into at least one orientation bin of a plurality of orientation bins and determining diversity of the plurality of orientation bins that include calibration measurements. Each orientation bin of the plurality of orientation bins may correspond to orientation measurements obtained within a five-degree increment. In one implementation, determining the degree comprises determining a range or variance of orientations at which the plurality of calibration measurements were obtained. The one or more calibration parameters are inputs to a filter and may be updated at the filter to generate calibration results. In some implementations a Kalman filter may be used.

An exemplary device for performing embodiments of the invention using components of the device such as the calibration module may include receiving a plurality of calibration measurements associated with one or more sensors of a device, determining a degree to which the plurality of calibration measurements were obtained at different orientations of the device, and determining, based on the degree, whether to update one or more calibration parameters. The sensors may be one or more of an accelerometer, a gyroscope or a magnetometer. In one implementation, determining the degree to which the plurality of calibration measurements were obtained at different orientations may comprise calculating an orientation entropy for the plurality of calibration measurements. The device may further comprise updating the one or more calibration parameters in response to determining that the orientation entropy exceeds a predetermined threshold. In one aspect, in response to determining that the orientation entropy is below a predetermined threshold, the components of the device discards a calibration measurement for an orientation for which a calibration measurement has been previously received without updating the one or more calibration parameters. In another aspect, in response to determining that the orientation entropy is below a predetermined threshold, components of the device may use a calibration measurement for an orientation for which a calibration measurement has been previously received without updating the one or more calibration parameters. In another implementation, determining the degree to which the plurality of calibration measurements were obtained at different orientations is based at least in part on a histogram for the plurality of calibration measurements.

In one implementation of the device, determining the degree to which the plurality of calibration measurements were obtained at different orientations may comprise binning each of the plurality of calibration measurements into at least one orientation bin of a plurality of orientation bins and determining diversity of the plurality of orientation bins that include calibration measurements. Each orientation bin of the plurality of orientation bins may correspond to orientation measurements obtained within a five-degree increment. In one implementation, determining the degree comprises determining a range or variance of orientations at which the plurality of calibration measurements were obtained. The one or more calibration parameters are inputs to a filter and may be updated at the filter to generate calibration results. In some implementations a Kalman filter may be used.

An exemplary non-transitory computer readable storage medium, wherein the non-transitory computer readable storage medium comprises instructions executable by a processor, the instructions comprising instructions to receive a plurality of calibration measurements associated with one or more sensors of a device, determine a degree to which the plurality of calibration measurements were obtained at different orientations of the device, and determine, based on the degree, whether to update one or more calibration parameters.

An exemplary apparatus for performing embodiments of the invention includes means for receiving a plurality of calibration measurements associated with one or more sensors of a device, means for determining a degree to which the plurality of calibration measurements were obtained at different orientations of the device, and means for determining, based on the degree, whether to update one or more calibration parameters. The sensors may be one or more of an accelerometer, a gyroscope or a magnetometer. In one implementation, determining the degree to which the plurality of calibration measurements were obtained at different orientations may comprise means for calculating an orientation entropy for the plurality of calibration measurements. The apparatus may further comprise means for updating the one or more calibration parameters in response to determining that the orientation entropy exceeds a predetermined threshold. In one aspect, in response to determining that the orientation entropy is below a predetermined threshold, the apparatus may have a means to discard a calibration measurement for an orientation for which a calibration measurement has been previously received without updating the one or more calibration parameters. In another aspect, in response to determining that the orientation entropy is below a predetermined threshold, the apparatus may use a means for a calibration measurement for an orientation for which a calibration measurement has been previously received without updating the one or more calibration parameters. In another implementation, determining the degree to which the plurality of calibration measurements were obtained at different orientations is based at least in part on a histogram for the plurality of calibration measurements.

In one implementation of the apparatus, determining the degree to which the plurality of calibration measurements were obtained at different orientations may comprise means for binning each of the plurality of calibration measurements into at least one orientation bin of a plurality of orientation bins and determining diversity of the plurality of orientation bins that include calibration measurements. Each orientation bin of the plurality of orientation bins may correspond to orientation measurements obtained within a five-degree increment. In one implementation, determining the degree comprises means for determining a range or variance of orientations at which the plurality of calibration measurements were obtained. The one or more calibration parameters are inputs to a filter and may be updated at the filter to generate calibration results. In some implementations a Kalman filter may be used.

The foregoing has outlined rather broadly features and technical advantages of examples in order that the detailed description that follows can be better understood. Additional features and advantages will be described hereinafter. The conception and specific examples disclosed can be readily utilized as a basis for modifying or designing other structures for carrying out the same purposes of the present disclosure. Such equivalent constructions do not depart from the spirit and scope of the appended claims. Features which are believed to be characteristic of the concepts disclosed herein, both as to their organization and method of operation, together with associated advantages, will be better understood from the following description when considered in connection with the accompanying figures. Each of the figures is provided for the purpose of illustration and description only and not as a definition of the limits of the claims.

BRIEF DESCRIPTION OF THE DRAWINGS

Aspects of the disclosure are illustrated by way of example. The following description is provided with reference to the drawings, where like reference numerals are used to refer to like elements throughout. While various details of one or more techniques are described herein, other techniques are also possible. In some instances, well-known structures and devices are shown in block diagram form in order to facilitate describing various techniques.

A further understanding of the nature and advantages of examples provided by the disclosure can be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, the reference numeral refers to all such similar components.

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

I. Overview of Auto-Calibration

Figure 1:
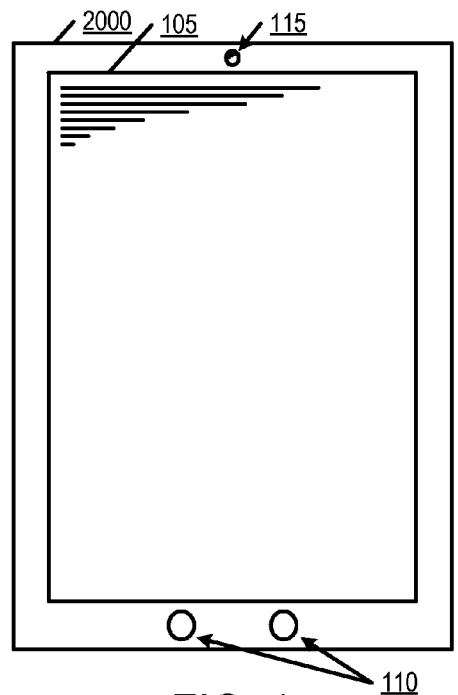
FIG. 1 illustrates an example device that may implement one or more aspects of the disclosure.
Figure 2:
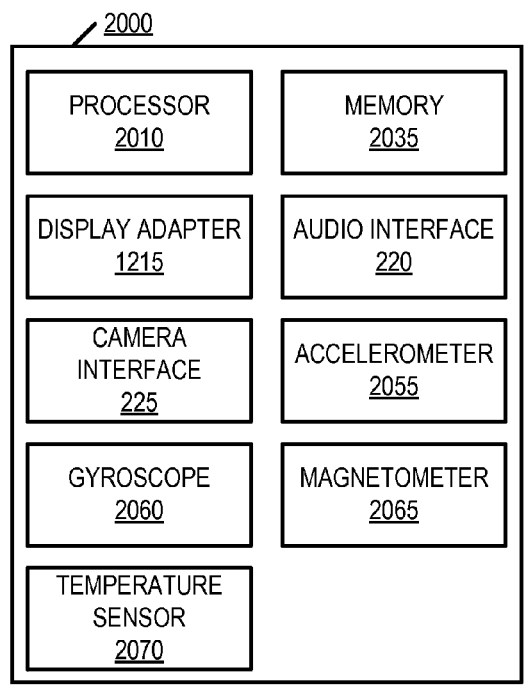
FIG. 2 illustrates another example device that may implement one or more aspects of the disclosure.
Figure 20:
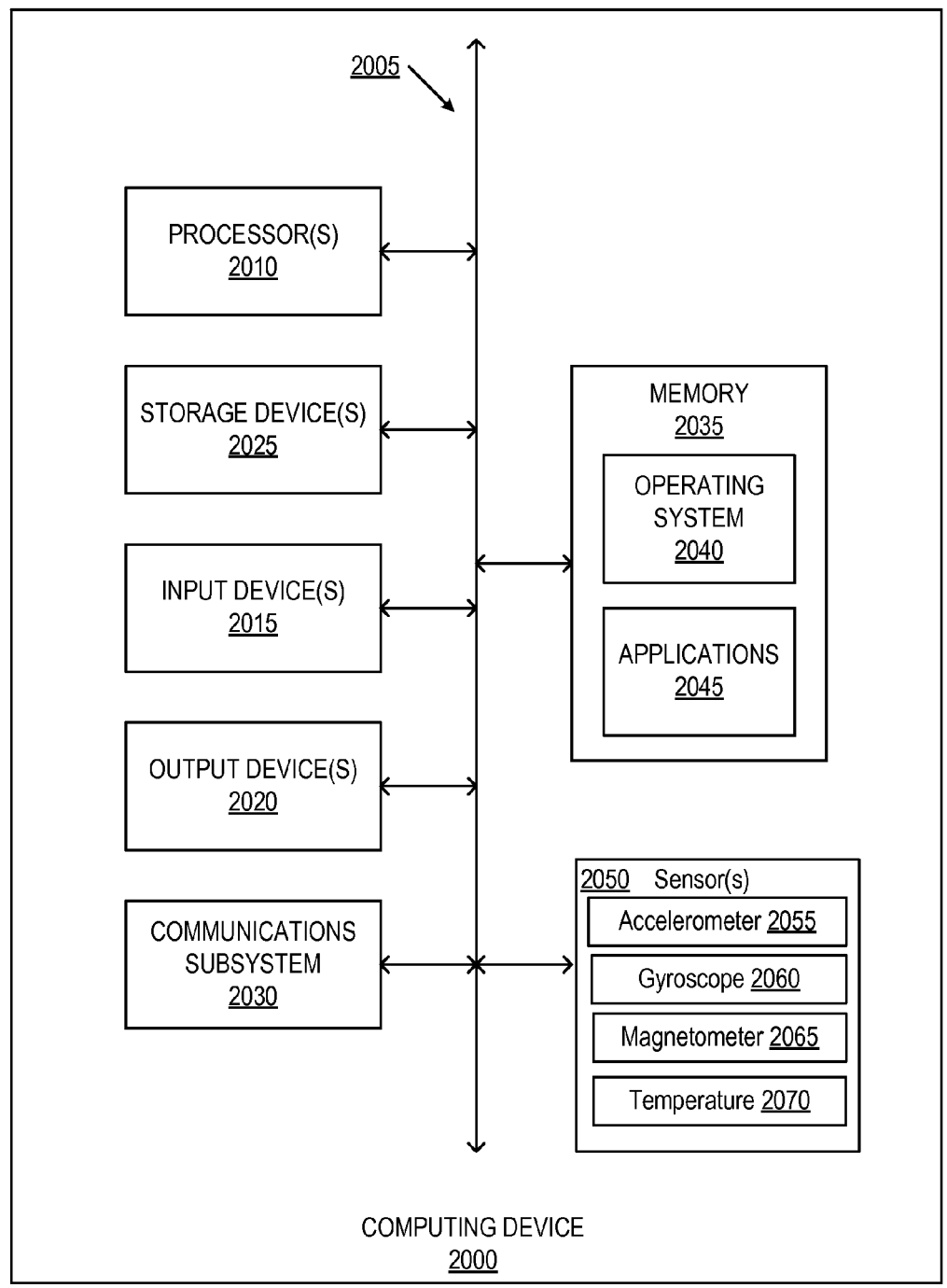
FIG. 20 illustrates an example of a computing system in which one or more embodiments may be implemented.

FIGS. 1 and 2 illustrate example devices that may implement one or more aspects of the disclosure and may implement components of the computing device 2000 described in more detail with reference to FIG. 20. As illustrated in FIG. 1, for example, computing device 2000 may include one or more components such as a display 105, buttons and/or keys 110, and/or a camera 115. In some arrangements, display 105 may be a touch screen, such that a user may be able to provide touch-based user input to computing device 2000 via display 105.

In one or more arrangements, computing device 2000 may further include a plurality of internal components, such as those illustrated in FIG. 2. For example, computing device 2000 may include one or more processors (e.g., processor 2010), one or more memory units (e.g., memory 2035), at least one display adapter (e.g., display adapter 215), at least one audio interface (e.g., audio interface 220), one or more camera interfaces (e.g., camera interface 225), and/or other components.

In one or more embodiments, computing device 2000 may further include a plurality of sensors, such as one or more accelerometers (e.g., accelerometer 2055), one or more gyroscopes (e.g., gyroscope 2060), one or more magnetometers (e.g., magnetometer 2065), and/or one or more temperature sensors (e.g., temperature sensor 2070). Accelerometer 2055 may measure and/or provide (e.g., to processor 2010) information about acceleration experienced by computing device 2000 and/or otherwise sensed by accelerometer 2055 (e.g., due to electrical interference). Gyroscope 2060 may similarly measure and/or provide (e.g., to processor 2010) information regarding an orientation of computing device 2000. In addition, magnetometer 2065 may measure and/or provide (e.g., to processor 2010) information regarding a bearing of computing device 2000, and temperature sensor 2070 may measure and/or provide (e.g., to processor 2010) information about a temperature (e.g., an ambient temperature) experienced by computing device 2000.

According to one or more aspects, any and/or all of the sensors included in computing device 2000 (e.g., accelerometer 2055) may generate an electric signal in response to and/or as an output signal corresponding to changes in condition, such as motion detected by a particular sensor when the sensor and/or computing device 2000 are moved in one or more directions. Additionally, or alternatively, because of imperfections in how such sensors may be manufactured, normal deterioration during expected operation, and/or other factors that may create and/or contribute to inaccuracy in the data output by such sensors over time, it may be desirable to calibrate any and/or all of the sensors included in computing device 2000 so as to more accurately interpret signals output by such sensors.

As used herein, "calibrating" a sensor may include receiving raw sensor measurement data (e.g., an electrical signal) output by a sensor, such as an accelerometer, gyroscope, magnetometer, etc. and applying one or more scale factors and/or offsets to the raw data to calculate and/or otherwise determine a more accurate representation of motion corresponding to the received sensor data. The scale factors and offsets may independently and/or together be referred to as "calibration parameters," and each sensor may have its own corresponding set of calibration parameters. In addition, in applying calibration parameters to sensor data, a "scale factor" may be a coefficient or other value that is multiplied by received sensor data, and an "offset" may be a value that is added to the received sensor data.

In many current systems, calibration of sensors, such as accelerometers 2055, may be done at the time a computing device 2000 is manufactured (e.g., at the factory). Or, such calibration may be accomplished by prompting the user to manually perform a calibration routine, for instance, by moving the computing device 2000 through a set of different positions allowing for sensor data to be measured and recorded. Both of these calibration methods have attendant disadvantages, however. For instance, when a sensor, such as an accelerometer 2055, is calibrated only at a factory at the time the computing device is manufactured, if (and typically when) the quality of data measured by the sensor deteriorates over time, there might not be a way for this deterioration in the quality of sensor data to be corrected. Additionally, when, for example, a sensor, such as an accelerometer 2055, is calibrated by a user, the calibration routine, which may require accurate and/or particular measurements, may itself be subject to user-introduced errors.

By implementing one or more aspects of the disclosure, however, one or more sensors of a device, such as one or more accelerometers 2055, may be automatically calibrated during normal use, without prompting a user to perform a calibration routine and/or move the device through a set of different positions, for instance. Instead, and as further described in greater detail below, the computing device 2000 may measure and/or capture information used to calibrate one or more sensors at particular times, where the times may correspond to particular activities performed by and/or with the device.

Thus, in calibrating an accelerometer 2055, for example, it may be desirable to estimate offsets and scale factors that affect the accelerometer data. Offsets can be modeled as a constant error in the accelerometer signal, while scale factors can be modeled as multiplicative constants. Thus, a goal of calibration may be to estimate these constants from a signal corrupted by noise.

The vector accelerometer signal (e.g., received the signal received from accelerometer 2055 by processor 2010) may be modeled as $$a_x = x_0(1+x_{SF}) + x_{OFF} + \text{noise} \quad 1$$

$$a_y = y_0(1+y_{SF}) + y_{OFF} + \text{noise} \quad 2$$

$$a_z = z_0(1+z_{SF}) + z_{OFF} + \text{noise} \quad 3$$

where $a_x$ is accelerometer measurement returned by the sensor, $x_0$ is the true acceleration, $x_{OFF}$ is the offset on x-axis and $x_{SF}$ is the deviation of scale factor (from 1) on x-axis. Similar definitions may hold for other axes.

Depending on the orientation of the computing device 2000 (which may, for instance, comprise a mobile phone), the offsets and scale factors can manifest themselves differently on each axis.

Figure 3A:
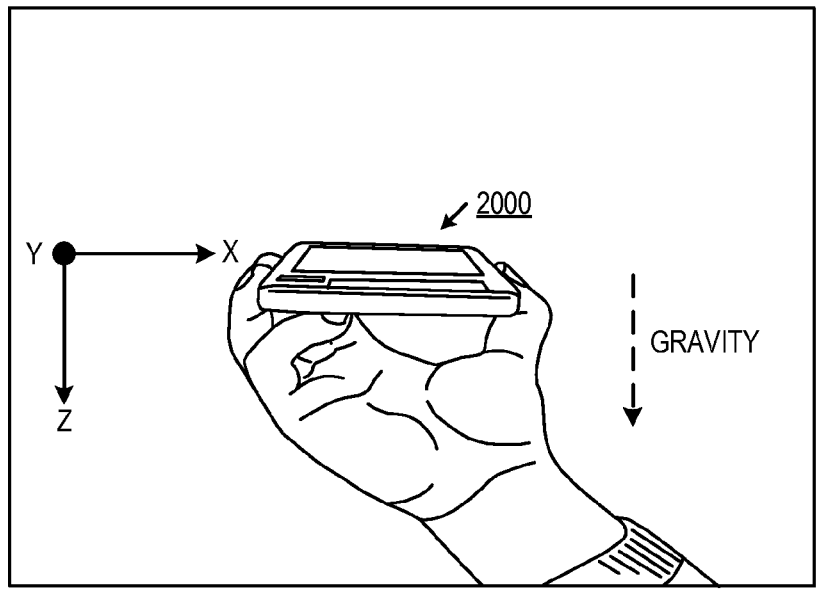
FIGS. 3A and 3B illustrate examples of how device orientation may affect acceleration vectors according to one or more illustrative aspects of the disclosure.
Figure 3B:
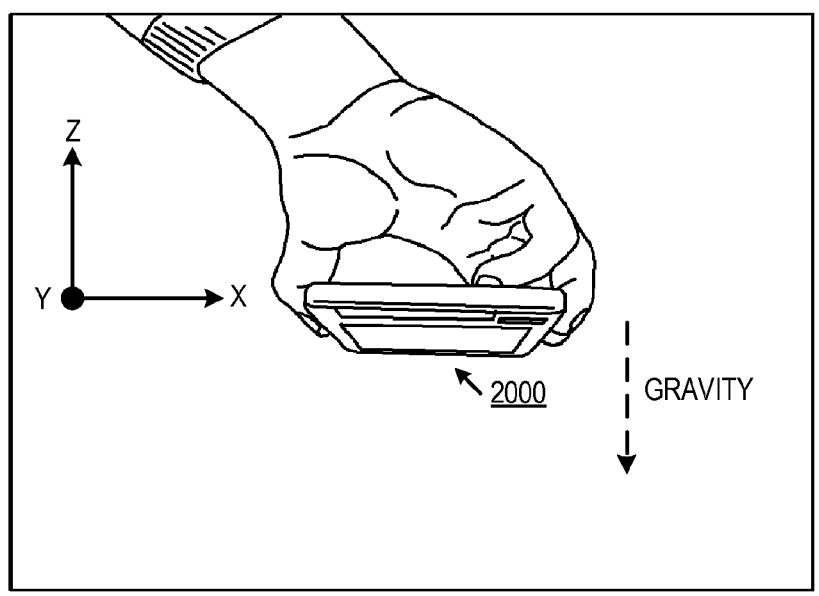

FIGS. 3A and 3B illustrate examples of how a computing device 2000 orientation may affect acceleration vectors according to one or more illustrative aspects of the disclosure. For example, as illustrated in FIG. 3A, the z-axis is aligned to gravity, and thus $a_x$ and $a_Y$ are expected to be 0. Due to the presence of offsets, $$a_x = x_{OFF} \text{ and } a_y = y_{OFF}. \text{ Note that } a_z = g(1+z_{SF}) + z_{OFF}.$$

As illustrated in FIG. 3B, the computing device 2000 is held such that the z-axis is aligned to gravity but upside down. Now, $a_{-z} = -g(1+z_{SF}) + z_{OFF}$.

Now, by solving the two equations, the offsets and scale factors can be obtained for the z-axis. These equations are:

$$z_{OFF} = \frac{(a_z + a_{-z})}{2}$$

$$z_{SF} = \frac{(a_z - a_{-z})}{2g} - 1$$

The offsets and scale factors can be computed by solving 2 equations for 2 unknowns as described above. The other axes can also be calibrated using the same methodology by placing the computing device 2000 such that the axis of interest is aligned to gravity and then away from it. The presumption that the orientation of the computing device is know allows for manual or factory calibration.

For auto-calibration, scalar acceleration may be an important concept. Scalar acceleration may be defined as the norm of the accelerometer data. For example, scalar acceleration may be expressed as:

$$\sqrt{a_x^2 + a_y^2 + a_z^2}.$$

When the computing device 2000 is stationary, and in the absence of any accelerometer errors, for any computing device 2000 orientation the scalar acceleration may be equal to gravity, i.e., scalar acceleration may be expressed as:

$$\sqrt{a_x^2 + a_y^2 + a_z^2} = g, \text{ where } g \text{ is gravity.}$$

For a given temperature, both offsets and scale factors can be assumed to be constant. Thus, during stationary periods, any change in the scalar acceleration lengths when compared to gravity can be attributed to the offset and scale factor errors. These noisy estimates of change in accelerometer lengths may be used to compute offsets and scale factors, by the processor, and may form the basis for auto-calibration algorithms.

In one or more calibration algorithms and/or methods described herein, difference between squared scalar acceleration and $g^2$ is used as a Kalman Filter (KF) measurement, as described in greater detail below. In addition, algorithms that rely on scalar acceleration may be independent of device orientation. Several measurements in different orientations (not necessarily orthogonal) may be needed in order to find the calibration parameters reliably in the presence of noise.

Figure 4:
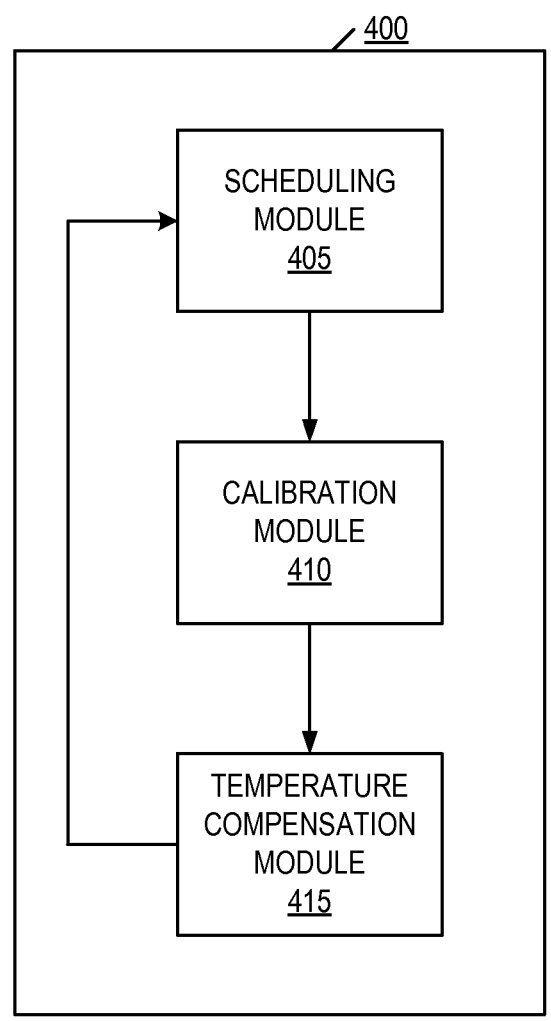
FIG. 4 illustrates an example of a system that implements various aspects of the disclosure.

FIG. 4 illustrates an example of a system that implements various aspects of the disclosure. As seen in FIG. 4, system 400 may be a system configured to perform sensor auto-calibration. In at least one arrangement, system 400 may be implemented as computer-readable instructions stored on a computer-readable medium, storage 2025 or memory 2035 that, when executed, cause a computing device to perform various steps, such as those described below. In another arrangement, system 400 or components of the system 400, such as the scheduling module, calibration module and the temperature compensation module may be implemented as hardware, software, firmware modules or any combination thereof.

According to one or more aspects, system 400 may include a scheduling module 405, a calibration module 410, and a temperature compensation module 415. Each of these modules are described in greater detail below.

As an overview, however, in at least one arrangement, scheduling module 405 may be responsible for scheduling the calibration and temperature compensation modules. The criteria chosen for initiating calibration may be based on power considerations (e.g., so as to reduce the power consumed by the device, such as computing device 2000, in automatically calibrating an accelerometer).

Calibration module 410 may include several sub-modules, such as a Stationary Detector module, a Feature Creation/Data Pre-processing module, a Kalman Filter module, a Feedback Monitor module, and a Decision Monitor module.

In one or more arrangements, temperature compensation module 415 may be responsible for management of results for each temperature range that the sensor operates. For every temperature encountered, one instance of the calibration module may be executed. The intermediate results can be stored in a look-up table and read back when the next sample at the same temperature is encountered.

According to one or more aspects, the modules of system 400 may operate together to perform and/or provide automatic sensor calibration. A high-level example of how these modules may operate and/or interact will now be described:

At the outset, scheduling module 405 may determine whether the computing device 2000 is in a high-power mode. Then, if scheduled, the temperature compensation module 415 may be activated. For every sensor measurement data and temperature data pair, two instances of the calibration module 410 may be updated, as further described below. One may bin at default or ambient temperature (e.g., to speed up convergence at ambient), and the other may bin at current temperature (e.g., to update the Kalman Filter (KF) for the particular temperature).

Subsequently, for each temperature bin, the sensor measurement (e.g., acceleration) sample may be passed to the calibration module 410. The sample may then be checked for stationarity. If it is found to be the end of a stationary period, average acceleration and variance may be computed in the Feature Creation module. The feature may be passed to the Kalman Filter, which may iteratively estimate the offsets and scale factors. If the calibration parameters for a particular temperature are detected to be reliable by the Decision Monitor, the reliability flag may be set.

Thereafter, at the end of the calibration module update, the temperature look-up table may be updated with the intermediate results or the final results along with the reliability flag.

In general, for convergence at each temperature, the Kalman Filter may need 100 to 150 reliable positions at every temperature for calibration. Thus, the table may be built over time. The temperatures encountered often (e.g., ambient) may have calibration parameters faster. Additional details regarding each of these modules, as well as other aspects of automatic accelerometer calibration, will now be described in greater detail in the sections that follow.

Figure 5:
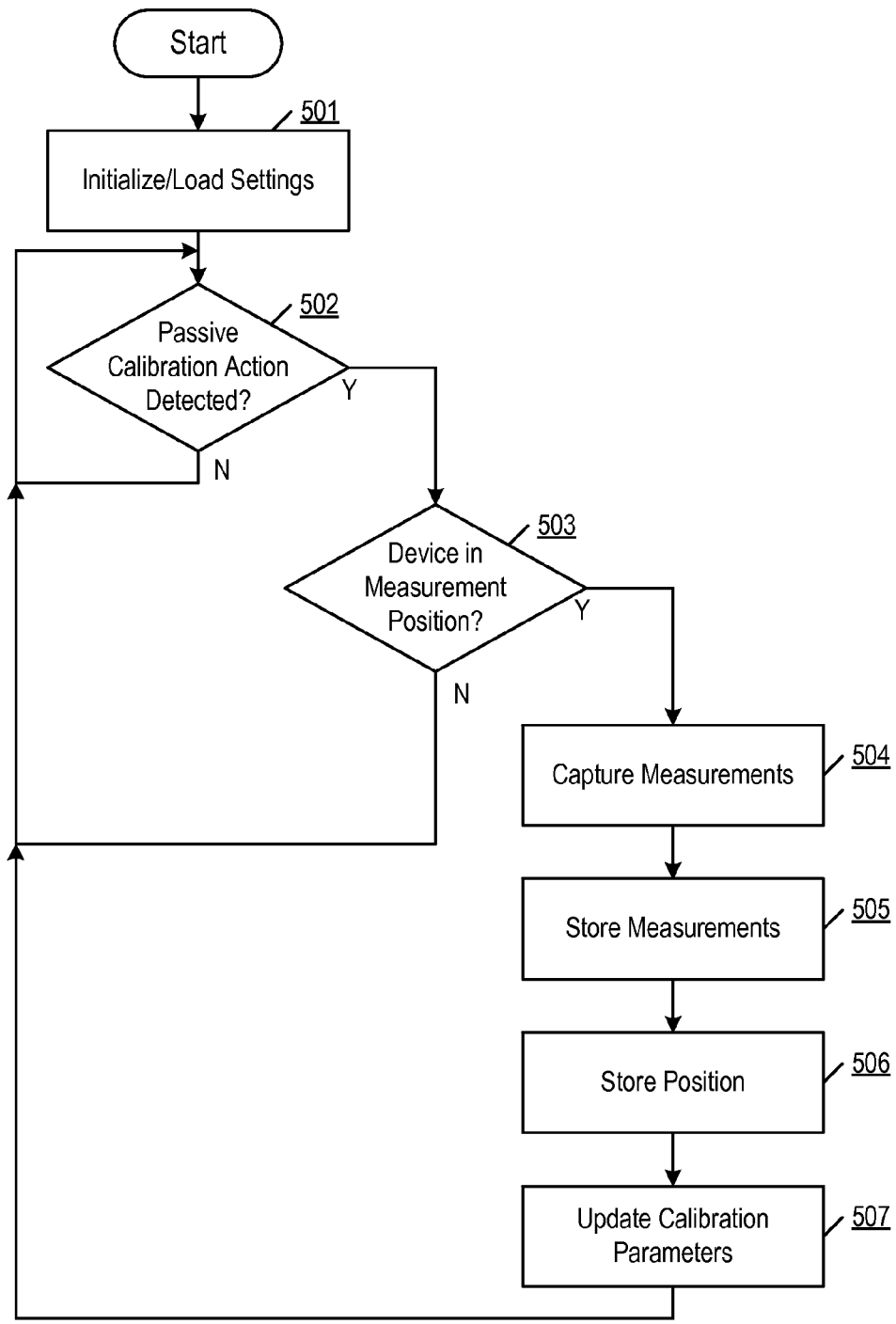
FIG. 5 illustrates an example method of automatically calibrating at least one accelerometer according to one or more illustrative aspects of the disclosure.

FIG. 5 illustrates an example method of automatically calibrating at least one sensor, such as an accelerometer 2055 according to one or more illustrative aspects of the disclosure. According to one or more aspects, any and/or all of the methods and/or methods steps described herein may be implemented by and/or in a computing device, such as computing device 2000 and/or the computer system described in greater detail below, for instance. In one embodiment, one or more of the method steps described below with respect to FIG. 5 are implemented by a processor of the computing device 2000, such as the processor 2010 or other processor. Additionally or alternatively, any and/or all of the methods and/or method steps described herein may be implemented in computer-readable instructions, such as computer-readable instructions stored on a computer-readable medium such as the memory 2035 or other computer-readable medium, internal or external to the computing device 2000, as described in greater detail below.

At block 501, a computing device 2000 (e.g., mobile device) may initialize and/or load information corresponding to settings and/or user preferences. In at least one arrangement, such information may include default calibration parameters for calibrating one or more accelerometers 2055 included in computing device 2000.

At block 502, it may be determined whether a passive calibration action has been detected. For example, at block 502, computing device 2000 may determine whether a passive calibration action has been detected. A passive calibration action may, for instance, include any action and/or activity in which a position and/or orientation of the device may be known or estimated. For example, a passive calibration action may be detected when a user concludes a telephone call, at which time it may be known that the device is held in a user's hand in a certain way and/or laying flat on a table or other surface. Other possible activities and/or actions that may operate as passive calibration actions are further described in greater detail below with respect to the scheduling module. Performing aspects of the invention in response to detecting the passive calibration action may be advantageous since the scheduling occurs opportunistically, e.g. it may occur during natural use by the user of the computing device without prompting the user to perform a specific action or place the computing device in a specific orientation.

At block 503, it may be determined whether the device is in a measurement position. For example, at block 502, computing device 2000 may determine whether it is in a measurement position. A measurement position may refer to and/or include a position where the device is orthogonal to at least one axis. In one or more additional and/or alternative arrangements, a measurement position may refer to and/or include any position where the device's orientation may be known with respect to one or more axes. For instance, the device's orientation with respect to one or more axes may be known using sensors other than one or more accelerometers 2055 to be calibrated, such as one or more gyroscopes 2060, one or more magnetometers 2065, one or more other accelerometers 2055, and/or the like.

At block 504, measurements may be captured or obtained. For example, at block 504, computing device 2000 may receive signal input from one or more accelerometers (e.g., accelerometer 1230). Such signal input may correspond to a detected and/or measured amount of acceleration during a particular time.

At block 505, the measurements may be stored. For example, at block 505, computing device 2000 may store (e.g., in memory 1210) information about the signal received at block 504 from the one or more accelerometers. Such information may include information about the signal's amplitude at one or more points in time, frequency information, and/or other information associated with the signal.

At block 506, information about the position at which the signal was captured may be stored. For example, at block 506, computing device 2000 may store (e.g., in memory 1210) information regarding the orientation of the device (e.g., in units of degrees), the bearing of the device, and/or other position information about the device corresponding to the time(s) at which the signal was captured. As described below, this position information may subsequently be used in determining a confidence level for calibration parameters determined based on the signal (e.g., using orientation entropy and/or frequency binning techniques, as further described below).

Subsequently, at block 507, one or more calibration parameters may be updated. For example, at block 507, computing device 2000 may calculate one or more scale factors and/or offset parameters for an accelerometer (e.g., using one or more techniques described in greater detail below), and the calculated scale factors and/or offset parameters may be used to update one or more calibration parameters. For instance, the one or more calculated scale factors and/or offset parameters may simply replace preexisting scale factors and/or offset parameters. Additionally or alternatively, algorithms may be used, e.g., as further described below, to determine how the one or more calculated scale factors and/or offset parameters should be combined with and/or be used to modify preexisting scale factors and/or offset parameters.

Thereafter the method may continue to run as a non-real time, non-latency sensitive background process (e.g., computing device 2000 may continue to execute the method as a background process) so as to continue to gather calibration data and/or apply calibration adjustments. For example, the method may return to block 502, in which computing device 2000 may again determine whether a passive calibration action has been detected. Additionally or alternatively, if it is determined at block 502 that a passive calibration action has not been detected, and/or if it is determined at block 503 that the device is not in a measurement position, then the method again may loop back to step 502 and continue to run as a background process.

In this way, the method may allow computing device 2000 to capture more measurements and positions over time. Because, as described above, the equations being solved involve two variables (i.e., scale factor and offset), it may be desirable to capture at least two measurements per axis so as to solve the system of equations. Moreover, by running the method as a background process in a looped fashion, e.g., as described above, the accuracy of the calibration may improve over time. In particular, as the computing device 2000 sees more positions and obtains more measurements corresponding to those positions, the calibration parameters may be based on a larger sampling of measurements and accordingly may become more accurate. Additionally or alternatively, power savings may be realized by running this method, e.g., in combination with other aspects described herein, such as the scheduling module described below, which intelligently selects certain times for obtaining calibration measurements.

II. Scheduling Module

Embodiments of the invention describe scheduling an execution of a task on a computing device 2000. In some embodiments the task may be a non-real time, non-latency sensitive background task such as calibrating the sensors coupled to the device. Sensors may include, but are not limited to accelerometers 2055, gyroscopes 2060, magnetometers 2065, barometers, etc. The task may be scheduled to execute while one or more components of the computing device 2000 are active or in a high power mode, the device battery is charging, or during periods of anticipated high quality data. In one embodiment, the scheduling of the task may occur during the high power mode, while the device is charging, or following a triggering event such as ringing/vibration of a phone that leads to a state with high quality data.

In some implementations, the determination if the computing device 2000 is in high power mode is based on the power consumption due to the execution of tasks during the high power mode. In other implementations, the determination if the computing device 2000 is in high power mode is based on the determination that the current state is one of a plurality of states associated with a power level above the threshold. In yet other implementations, the device or components of the device may have defined power states, such as various sleep states, activity states, low power states and high power states. Furthermore, some computing devices 2000 may have hardware hooks that allow access to the power state of the computing device 2000, facilitating the determination if the computing device 2000 is in a high power mode.

In some embodiments of the invention, sensor measurement data from the sensors are captured without prompting a user to place the device in a calibration position or prompting the user to execute a calibration routine. Calibration of the sensors coupled to the device may be performed automatically by the processor 2010. Continuous calibration of the sensors, such as accelerometers 2055, gyroscopes 2060, magnetometers 2065, barometers, etc., may have considerable implications on power consumption of the computing device 2000. In one aspect, the method for calibrating the sensor coupled to the computing device 2000 may be performed on an Application processor, DSP processor or any other computing module coupled to the computing device 2000. It may be advantageous to perform the calibration less frequently to conserve power. For example, continuously calibrating the device sensors during a period of low activity may prevent the device from entering low power states or entirely turning off parts of the device to conserve power.

Aspects of the invention describe methods for opportunistically calibrating the sensors coupled to the computing device 2000 to conserve power. Generally, calibration of the computing device 2000 may be triggered when the device is in an activity state or during certain activities that produce high quality calibration data. Additionally, calibration may be randomly and deterministically scheduled to compensate for situations where the calibration has not been triggered for a set period of time.

Deterministic Scheduling Based on Triggers

Calibration of the sensors coupled to the computing device 2000 may be performed or scheduled when the computing device 2000 or certain components of the computing device 2000 are in an active state. For the active state of the computing device 2000 the different components of the computing device 2000 may have different levels of power management and activity states. Aspects of the invention may perform calibration during activity states that are associated with higher power consumption. When the computing device 2000 is already active and performing other useful tasks, the power associated with collecting calibration data is negligible compared to the other tasks. For example, the device may be in a high power mode when the display for the device is turned ON or when the Application processor is running. The display is turned ON during such activities as emailing, texting, receiving or placing a call, computing device 2000 ringing or vibrating, communicating using the computing device 2000 or browsing the web on the computing device 2000 and playing games and sensor measurements for generating calibration data may be collected by the processor during such activity states.

In some aspects, calibration may be triggered by certain activities that produce high quality calibration data. Calibrating the computing device sensors during these activities may be desirable to collect the high quality calibration data, even if the device is not operating in a high power mode. High quality calibration data may include, but is not limited to calibration data that may be used for offsetting the sensor measurements with high confidence. For instance, for an accelerometer, high quality calibration data may include calibration data collected while the device is stationary. Furthermore, the quality of the data with respect to the calibration results may be improved by increasing the number of orientations associated with collected calibration data. Making and receiving calls is an example of a possible trigger for collecting calibration data that may provide valuable calibration data. In some devices, the Application processor may be turned off and a supplemental processor, micro-controller, DSP, or an ASIC may be used for conducting the call. Also, the display may also be turned off during the call to conserve power. Therefore, the device operates at a low power state with both the Application processor and the display is turned off. However, high quality calibration data with multiple orientations may be captured during a phone call. The number of orientation angles covered at each of the X, Y and Z axis may be significantly improved when the calibration data is acquired while making and receiving calls. In other aspects, calibration of the sensors on the computing device may also be deterministically scheduled with the power consumption by the computing device 2000 is not a primary concern. For example, when the computing device 2000 battery is charging, power conservation may not be a priority and calibration of the computing device 2000 may be deterministically scheduled.

Figure 6:
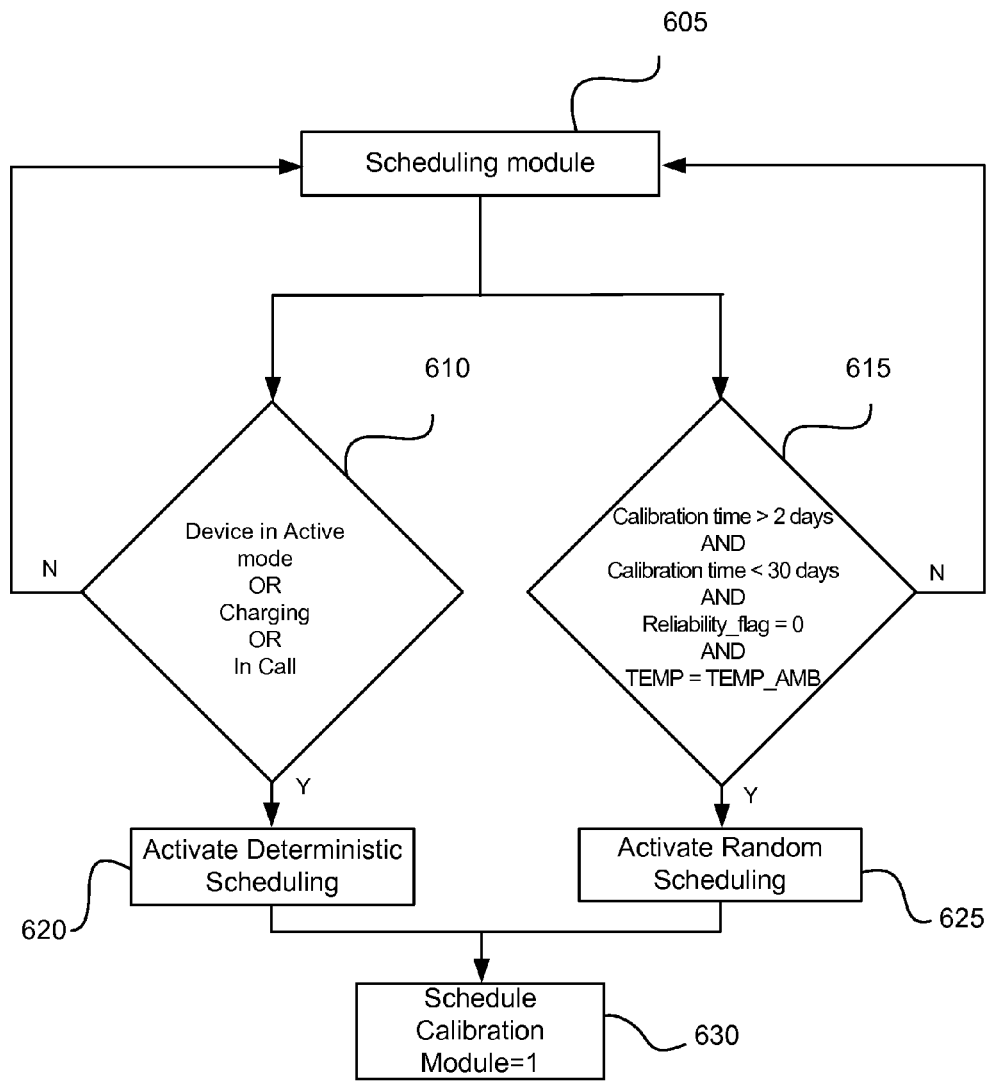
FIG. 6 is a simplified flow diagram illustrating a non-limiting example for scheduling collection of calibration data.

FIG. 6 is a simplified flow diagram illustrating a non-limiting example for scheduling collection of calibration data. The process 600, such as the scheduling module 405/605, described in FIG. 6, may be performed by processing logic that comprises hardware (circuitry, dedicated logic, etc.), software (such as is run on a general purpose computing system or a dedicated machine), firmware (embedded software), or any combination thereof. In one embodiment, the process 600 is performed by one or more computing devices 2000 as described in FIG. 20. In one embodiment, the sensors 2050 acquire the sensor input for further processing by filtering and processing components of the device described in FIG. 20.

At block 605, the scheduling module from the computing device 2000 periodically performs checks for scheduling needs. At block 610, the scheduling module of the computing device 2000 checks if the device is in an activity state, charging or in a voice call. At block 620, if the scheduling module detects that the device is in an activity state, charging or in a call, the scheduling module may activate deterministic scheduling. At block 630, the calibration module is triggered for collecting calibration data using the sensors coupled to the computing device 2000.

In one implementation, an activity mode may be determined by assessing the power level associated with the state of the device. For instance, the device may be considered to be in an activity mode if the power consumption level associated with the device is above a threshold level or the state of the device is one of a plurality of states associated with a power level above a pre-determined threshold level. Activity modes may include but are not limited to emailing, texting, receiving or placing a call, device ringing or vibrating, communicating using the device or browsing the internet on the device. Ringing and vibrating of a computing device 2000, such as a mobile device may also act as a trigger to an activity state, such as receiving a phone call.

In some implementations, if the scheduling module executed by the processor 2010 of the computing device 2000 detects the computing device 2000 in one of the orientations associated with high quality calibration data, the scheduling module schedules collection of calibration data for a period of time. For some sensors, such as accelerometers 2055, one or more orientations may be associated with high quality calibration data based on determining that the computing device 2000 is stationary or substantially stationary at a particular orientation. In some implementations, the transition of the device to a lower power state or a sleep state may be delayed at least until the completion of the collection of calibration data. The delay in the transition of the device to a lower power state or a sleep state may be based on anticipating a transition of the computing device to a state associated with high quality data, and wherein the calibration data is collected during this state of high quality data. In one embodiment, the computing device 2000 may enter an intermediary state between the high power state and the low power state for collecting calibration data.

Random Scheduling

The computing device 2000 may randomly schedule calibration of the one or more sensors 2050 to compensate for situations where the calibration has not been triggered for a set amount of time. In such situations, aggressive scheduling may be needed to calibrate the sensors 2050 associated with the computing device 2000, before the computing device 2000 can solely rely on trigger based calibration of the computing device 2000. During random scheduling mode, the computing device 2000 may collect calibration data regardless of the activity state or other power considerations for the computing device 2000. The calibration algorithm executed by the processor 2010 of the computing device 2000 can further provide an option to switch to aggressive scheduling if convergence has not occurred based on the levels of entropy on each axis.

Referring back to FIG. 6, at block 615, the scheduling module may determine an insufficiency in the collected calibration data or a lack of convergence and in response to determining the insufficiency or the lack of convergence in the collected calibration data, activate random scheduling for the collection of calibration data for the sensors. In one embodiment, the lack of convergence in the collected calibration data may be determined based on the lack of scheduling of the second task for a fixed period of time. In one exemplary implementation, at block 625, if the last calibration was performed more than 2 days ago and less than 30 days ago, random scheduling for calibration data may be activated. In addition, at block 615, the scheduling module performed by the processor 2010 may check if the calibration data is considered reliable and if the sensors 2050 are at ambient temperature before activating random scheduling. At block 630, the calibration module may be triggered for collecting calibration data using the sensors 2050 coupled to the computing device 2000

It should be appreciated that the specific steps illustrated in FIG. 6 provide a particular method of switching between modes of operation, according to an embodiment of the present invention. Other sequences of steps may also be performed accordingly in alternative embodiments. For example, alternative embodiments of the present invention may perform the steps outlined above in a different order. To illustrate, a user may choose to change from the third mode of operation to the first mode of operation, the fourth mode to the second mode, or any combination there between. Moreover, the individual steps illustrated in FIG. 6 may include multiple sub-steps that may be performed in various sequences as appropriate to the individual step. Furthermore, additional steps may be added or removed depending on the particular applications. One of ordinary skill in the art would recognize and appreciate many variations, modifications, and alternatives of the process.

Anticipation of Orientation Positions

In certain aspects of the invention, a timeout may be implemented after certain activities and before the device enters a low power state to capture calibration data associated with anticipated orientations of the device. The timeout may further delay the computing device 2000 from entering a low power state for the timeout period so that calibration data can be obtained. For instance, a user may place the computing device 2000 in various locations after emailing, texting or browsing the web, such as shirt or pant pocket, table, handbag, etc., yielding high quality orientation data for calibrating the device sensors.

In some implementations, the scheduling device may anticipate a transition to a second state of the device based on the current state of the computing device 2000, wherein the second state is associated with high quality data, and wherein the calibration data is collected during the second state, and delay the transition of the computing device 2000 to a lower power level for a first period of time in anticipation of a transition to the second state of the computing device 2000. If the transition of the device to the second state is detected during the first period of time, the transition of the device to a lower power state may be delayed for a second period of time, and the collection of calibration data may be scheduled for the second period of time.

Figure 7:
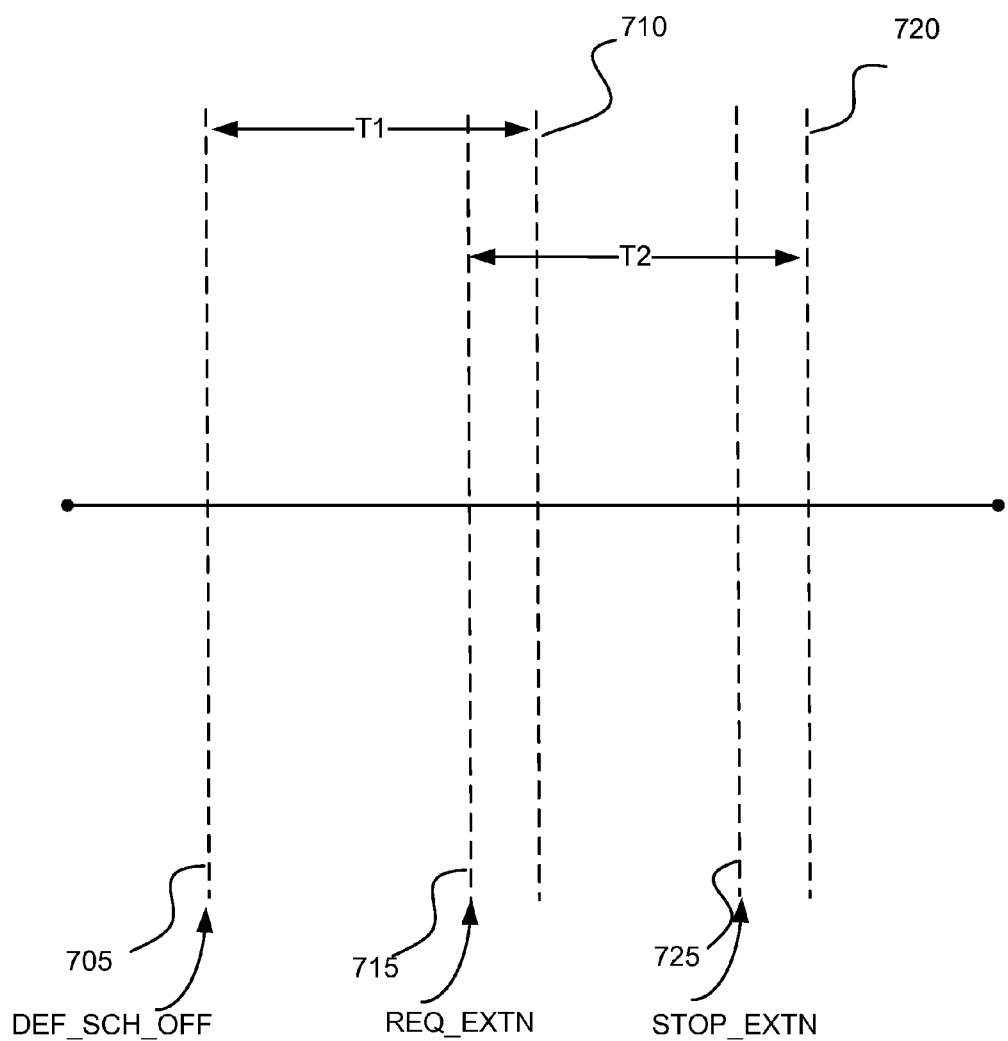
FIG. 7 is a timing diagram illustrating an exemplary implementation for extending the window for collecting calibration data in anticipation of orientations of the computing device associated with high quality calibration data.

FIG. 7 is a timing diagram illustrating an exemplary implementation for extending a window for collecting calibration data in anticipation of orientations of the computing device 2000 associated with high quality calibration data. At time 705, the completion of the activity associated with high quality calibration data, higher power, or a power saving agnostic state such as charging the battery of the computing device 2000 may be detected. In one embodiment, the computing device 2000 may produce a DEF_SCH_OFF trigger, at time 705, in response to detecting the completion of the activity state. The computing device 2000 also continues to monitor the state of the computing device 2000 for a first period of time (T1 in FIG. 7), ending at time 710, in anticipation of detecting relatively stationary positions or orientations of interest for collecting calibration data for the computing device 2000. These stationary positions and orientations of the computing device 2000 may be associated with durations of availability of high quality calibration data. If an orientation of interest is detected during the first period of time (T1), the scheduling module may signal a request (REQ_EXTN at time 715) for an extension of time for a second period of time (T2 in FIG. 7), ending at time 720, for collecting high quality calibration data. In FIG. 7, the collection of the calibration data may be halted at time 720 that also marks the end of the second time period. Alternatively, at time 725, the scheduling module, executed by the processor 2010, may stop collecting calibration data when by asserting a STOP_EXTN signal.

II. Calibration Module

In the discussion that follows, as well as in other portions of the disclosure, such as the accompanying figures, the terminology defined in the following table may be used:

| Term | Definition |
|---|---|
| CL_OFF | Closed loop offset, stores the offset parameter (iteratively updated) |
| CL_SF | Closed loop scale factor, stores the scale factor parameter (iteratively updated) |
| OFF_CORR | Offset corrections computed from KF after loop closure |
| SF_CORR | Scale factor corrections computed from KF after loop closure |
| QMD | QMD = 1 means motion state, 0 means stationary |
| CALC_ENT | Function invoked to computed orientation entropy |
| LSB | LSB size of the sensor |
| TEMP | Current temperature |
| TEMP_AMB | Ambient temperature |
| K | Sensor offset temperature coefficient |
| CL_FLAG | Closed loop active flag |
| P | Covariance matrix of the KF |
| RES | KF residuals |
| ENT | Orientation entropy values |
| COV RATIOS | Ratio of variance to covariance terms |
| TBIN | Temperature bin |

Figure 8:
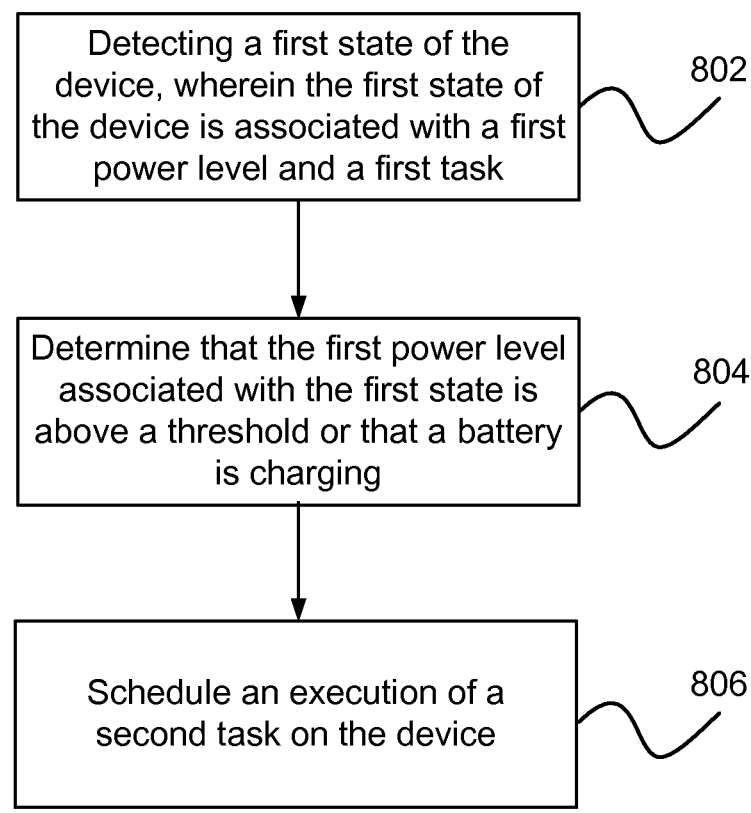
FIG. 8 is a simplified flow diagram illustrating a non-limiting method performed by embodiments of the invention for scheduling an execution of a task on a computing device.

FIG. 8 is a simplified flow diagram illustrating a non-limiting method performed by embodiments of the invention for scheduling an execution of a task on a computing device 2000. The process 800, such as the calibration module, may be performed by processing logic that comprises hardware (circuitry, dedicated logic, etc.), software (such as is run on a general purpose computing system or a dedicated machine), firmware (embedded software), or any combination thereof. In one embodiment, the process 800 is performed by one or more computing devices 2000 as described in FIG. 20.

Referring to exemplary FIG. 8, at block 802, components of the computing device 2000 performing embodiments of the invention may detect a first state of the computing device 2000, wherein the first state of the computing device 2000 may be associated with a first power level and a first task. At block 804, embodiments of the invention may determine that the first power level associated with the first state is above a threshold or that a battery coupled to the device is charging. At block 806, embodiments of the invention may schedule an execution of a second task on the computing device 2000, in response to determining that the first power level associated with the first state is above the threshold or that the battery coupled to the device is charging. The second task on the device may be a non-real time task, non-latency sensitive task or a background task.

In one embodiment, determining of the first power level associated with the first state is based on the power consumption while executing the first task. In another embodiment, determining that the first power level associated with the first state is above the threshold comprises determining that the first state is one of a plurality of states associated with a power level above the threshold. The plurality of states associated with the power level above the threshold may comprise having one or more of the display of the device turned on, the application processor performing activity, emailing texting, receiving or placing a call, device ringing or vibrating, communicating using the device or browsing the internes on the device. In yet another embodiment, determining of the first power level associated with the first state is based on accessing the power state of the computing device 2000 by accessing hardware mechanisms on the computing device 2000.

In one embodiment, the second task may be associated with automatically collecting of calibration data using a sensor 2050. The sensor measurements from the sensor may be captured without prompting a user to place the computing device 2000 in a calibration position or prompting a user to execute a calibration routine. The sensor 2050 may be one of an accelerometer 2055, a gyroscope 2060, or a magnetometer 2065. Automatically collecting calibration data by the processor 2010 may comprise monitoring the computing device 2000 for an orientation associated with high quality calibration data at a plurality of orientations for a first period of time, and in response to detecting the device is in one of the orientations associated with high quality calibration data, collecting calibration data for a second period of time. In one implementation collecting calibration data at the orientation associated with high quality data may further comprise determining that the computing device 2000 is stationary or substantially stationary at the orientation. In one aspect, the sensor measurements may be collected while the device is at the first power level for determining if the computing device 2000 has transitioned to an orientation associated with high quality calibration data for collecting calibration data using the sensor 2050 for a second period of time.

In one embodiment, the second task is scheduled and executing in the background while the primary/first task is completed. The method may further comprise delaying the transition of the device to a second power level at least until the completion of the second task, wherein the first power level is higher than the second power level. In one implementation, delaying the transition of the device to a second power level comprises anticipating a transition to a second state of the device, based on the first state of the device or a trigger such as ringing of a phone, wherein the second state is associated with high quality data, and wherein the calibration data is collected during the second state.

In another embodiment, the second task of collecting data may be performed after the completion of the first task, such as a phone call, when the computing device 2000 may probabilistically go to a stationary position. Herein, automatically collecting of calibration data using the sensor 2050 may include anticipating a transition to a second state of the device based on the first state of the device, wherein the second state is associated with high quality data, and wherein the calibration data is collected during the second state, and delaying the transition of the device to a second power level for a first period of time in anticipation of a transition to a second state of the device. The method may further comprise detecting a transition of the device to the second state within the first period of time, delaying the transition of the device to a second power level for a second period of time, in response to detecting a transition of the device to the second state within the first period of time; and scheduling the automatic collection of calibration data during the second period of time. The high quality calibration data may be collected during making or receiving phone calls.

In one embodiment, in response to determining insufficiency or lack of convergence in the collected calibration data, activate random scheduling of the second task on the device. The insufficiency or lack of convergence in the collected calibration data may be determined based on the lack of scheduling of the second task for a first period of time.

It should be appreciated that the specific steps illustrated in FIG. 8 provide a particular method of switching between modes of operation, according to an embodiment of the present invention. Other sequences of steps may also be performed accordingly in alternative embodiments. For example, alternative embodiments of the present invention may perform the steps outlined above in a different order. To illustrate, a user may choose to change from the third mode of operation to the first mode of operation, the fourth mode to the second mode, or any combination there between. Moreover, the individual steps illustrated in FIG. 8 may include multiple sub-steps that may be performed in various sequences as appropriate to the individual step. Furthermore, additional steps may be added or removed depending on the particular applications. One of ordinary skill in the art would recognize and appreciate many variations, modifications, and alternatives of the process.

Figure 9:
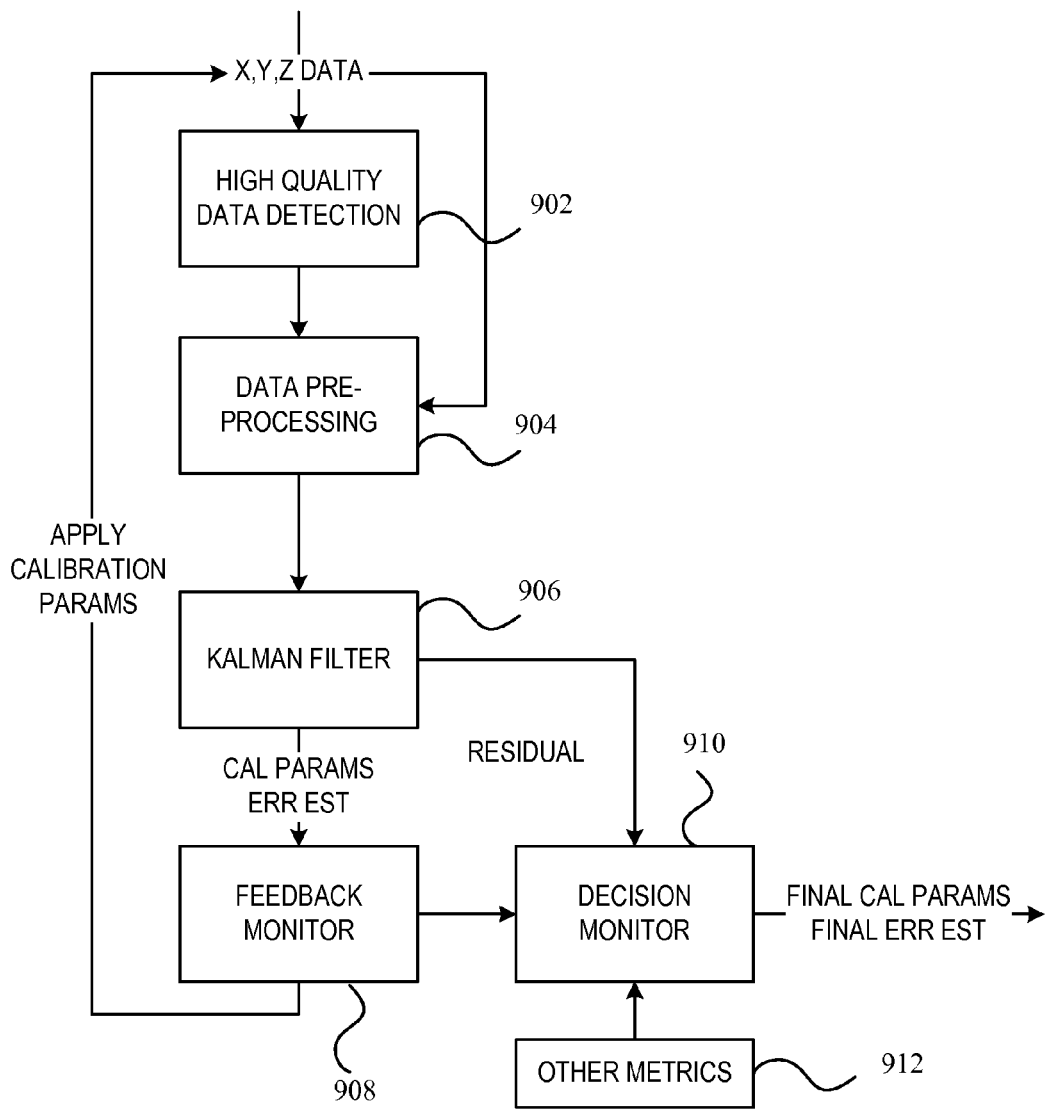
FIG. 9 illustrates exemplary components of the calibration module according to one or more illustrative aspects of the disclosure.

FIG. 9 illustrates an example components of a calibration module according to one or more illustrative aspects of the disclosure. In the passages that follow, functional blocks included in the diagram illustrated in FIG. 9 will be described in further detail. In the discussion that follows, as well as in other portions of the disclosure, such as the accompanying figures, embodiments of the invention may be described using an accelerometer 2055 as an exemplary sensor, however, other sensors such as gyroscopes 2060, magnetometers 2065, barometers, etc. may be used for implementing aspects of the invention instead. The various modules described in FIG. 9 may be implemented using hardware, software or firmware or any combination thereof.

At the outset of the example calibration module illustrated in FIG. 9, the incoming sensor 2050 samples may be tested for high quality data samples, at block 902. For an accelerometer 2055, the sensor samples may be tested for stationarity. Stationarity can be determined based on a combination of Qualcomm Motion Detector (QMD) and Gradient Motion Detector (GMD) and can be implemented within the calibration algorithm. Once the sample is determined to be stationary, it can be averaged with other samples that are part of the same stationary segment. The variance of the stationary segment data can also computed. For other sensors, such as gyroscopes 2060, other motions and orientations besides the stationarity of the device may be associated with high quality data.

Continuing to refer to FIG. 9, at block 904, the data pre-processing block pre-processes the sensor 2050 input before passing the data over to the Kalman Filter. For the exemplary embodiment including the accelerometer 2055, the pre-processing block 904 computes the scalar acceleration from the averaged accelerometer readings. The scalar acceleration variance is also computed as a function of the individual axes variances. These two features are passed to the Kalman Filter as the measurement and the noise estimates. The details on the feature creation and its variance estimation are described in greater detail below.

At block 906, the Kalman Filter may use inputs from the pre-processing block 904 to compute an estimate of the calibration parameters optimally (minimizing the mean squared error). At a high level, the Kalman Filter uses each new measurement weighted by its variance, thus automatically assigning smaller weights to measurements that are unreliable. The low variance or reliable measurements contribute more to the estimate and are incorporated into the last estimate appropriately. The Kalman Filter provides the calibration parameters and their error estimates. This block is discussed further below.

At block 908, the feedback block monitors the variance of the estimated calibration parameters. When the variances meet certain limits, the estimated parameters are deemed reliable for feedback. In other words, the estimated parameters are accurate enough to be applied to the incoming acceleration samples in real-time. Due to assumptions of linearity in the Kalman Filter model, the performance of the filter deteriorates when the offsets or scale factors are large. In order to mitigate these effects, the estimated parameters may be applied to the incoming samples. As the corrections are applied, the offsets remaining to be estimated become smaller; hence the effects of non-linearity are mitigated. Therefore, the accuracy and convergence may be improved by using feedback.

At block 910, the decision block may use data from the Kalman Filter block 906, the feedback monitor block 908 and independent metrics 912 and determine the quality and reliability of the estimated parameters. When the metrics indicate convergence accuracy at par with the requirements, the results of the calibration algorithm may be published to the client. Some metrics used are estimated parameter variance, residual from the Kalman Filter and orientation entropy. The metrics are discussed in more detail in FIG. 10, FIG. 11 and FIG. 12.

The Kalman Filter estimates a process by using a feedback control. The process state (offsets and scale factors) is estimated at some time, and then compared to the new noisy measurements. The remaining error is then feedback, and the process is repeated. One exemplary embodiment of the invention is described step-by-step here:

Step 1. As the stationary accelerometer measurements (computed over an entire stationary period or segment) and their variances are directed to the Kalman Filter, the time update phase projects the current offset and scale factor estimates ('State') and the variance. In this case, the current state is equivalent to the previous state (a priori) and the current covariance is equal to the last covariance matrix (a priori covariance).

Step 2. Next, the measurement update phase begins by first computing the Kalman gain. Next, the current measurement z is incorporated to generate the a posteriori estimate of the calibration parameters. At this time, the a posteriori variance is also updated.

Step 3. After each time and measurement update pair, the process is repeated with the previous a posteriori estimate used to predict a new a priori estimate. This recursive procedure is done until the desired accuracy is obtained.

Although specifics of accelerometer 2055 may be used in describing the embodiments of the invention, as discussed with respect to FIG. 8 above, any other sensors, such as magnetometers 2065, gyroscopes 2060, barometers, etc. may be used in embodiments of the invention.

Figure 10:
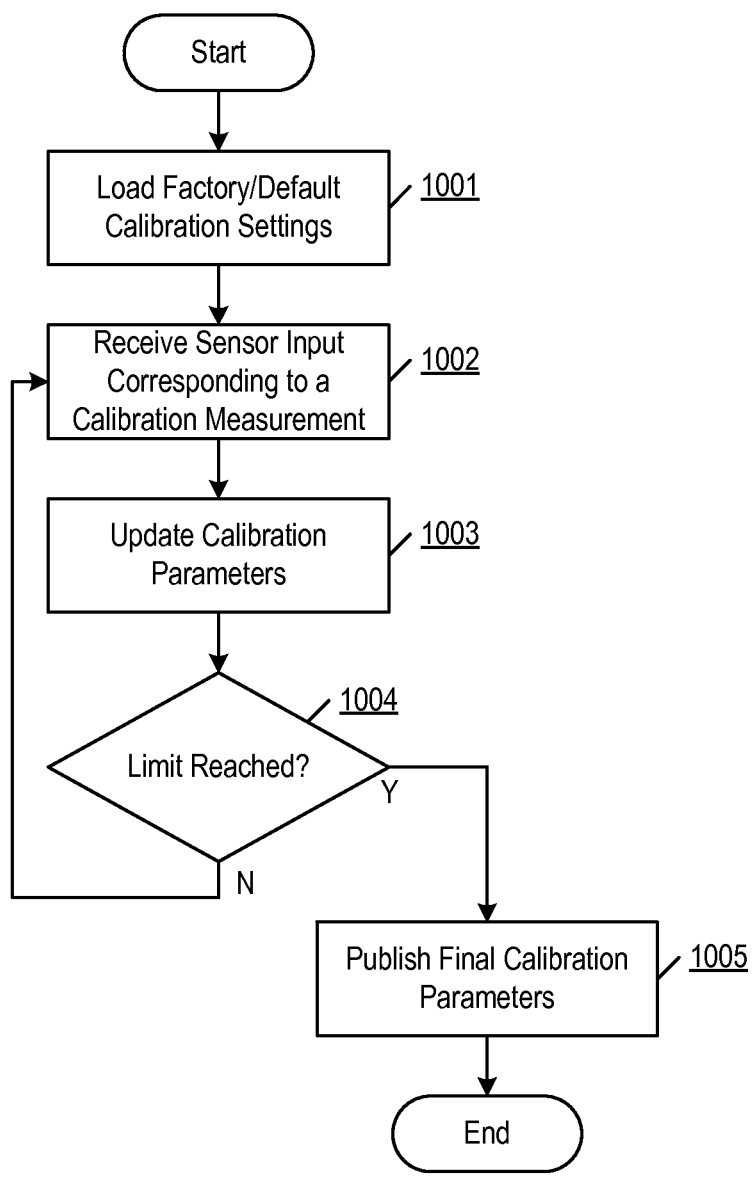
FIG. 10 illustrates an example method of updating calibration parameters using a feedback loop according to one or more illustrative aspects of the disclosure.

FIG. 10 illustrates an example method of updating calibration parameters using a feedback loop according to one or more illustrative aspects of the disclosure. Aspects of FIG. 10 discuss the decision monitor 910 from FIG. 9. The process 1000 is performed by processing logic that comprises hardware (circuitry, dedicated logic, etc.), software (such as is run on a general purpose computing system or a dedicated machine), firmware (embedded software), or any combination thereof. In one embodiment, the process 1000 is performed by one or more computer systems 2000 as described in FIG. 20. In one embodiment, the sensors 2050 acquire the sensor input for further processing by filtering and processing by components of the computing device 2000 described in FIG. 20.

As previously discussed, by using a feedback loop, such as the one described in this example method, measurement data may be applied to sensor readings in real-time (e.g., during an on-going automated calibration process) so as to incrementally improve performance. For example, if a device is to be calibrated over a three-day period, measurements captured on the first day may be used to apply calibration parameters to the accelerometer data on the second day, even though the full three-day calibration period has not yet concluded. In this example, by incrementally calibrating the sensor data, measurements on the second day will be more accurate, and, in turn, measurements on the third day will be more accurate as well.

At block 1001, factory/default calibration settings may be loaded. For example, in block 1001, computing device 2000 may load default calibration parameters (e.g., loaded on computing device 2000 at the time of manufacture in the factory, for instance).

At block 1002, sensor input corresponding to a calibration sensor measurement may be received. For example, at block 1002, computing device 2000 may receive such sensor input from one or more sensors, such as accelerometers 2055, included in computing device 2000. At block 1003, calibration parameters may be updated. For example, at block 1003, computing device 2000 may update one or more calibration parameters based on the received sensor input.

At block 1004, it may be determined whether a limit has been reached. For example, at block 1004, computing device 2000 may determine whether a sufficient number of position measurements have been taken to warrant finalization and/or publication of the one or more calibration parameters. In at least one arrangement, this determination may be based on a predetermined threshold. In other arrangements, this determination may be based on other factors, such as the diversity of the orientations obtained or other factors described discussed in FIG. 11 and FIG. 12. If it is determined at block 1004 that the limit has not been reached, then the method may return to block 1002 where additional sensor input may be received. In this way, a feedback loop, such as a feedback loop and/or closed loop may be formed. On the other hand, if it is determined, in block 1004, that the limit has been reached, then at block 1005, the final calibration may be published. For example, at block 1005, computing device 2000 may finalize, publish, and/or store the calibration parameters generated and/or tuned through various iterations of the feedback loop.

It should be appreciated that the specific steps illustrated in FIG. 10 provide a particular method of switching between modes of operation, according to an embodiment of the present invention. Other sequences of steps may also be performed accordingly in alternative embodiments. For example, alternative embodiments of the present invention may perform the steps outlined above in a different order. To illustrate, a user may choose to change from the third mode of operation to the first mode of operation, the fourth mode to the second mode, or any combination there between. Moreover, the individual steps illustrated in FIG. 10 may include multiple sub-steps that may be performed in various sequences as appropriate to the individual step. Furthermore, additional steps may be added or removed depending on the particular applications. One of ordinary skill in the art would recognize and appreciate many variations, modifications, and alternatives of the process.

The Decision Monitor module 910 monitors the quality of the estimated state, and allows for publishing the calibration results when required reliability is achieved. The Decision Monitor uses a combination of the following metrics to make the decision:

Estimated variance (diagonal elements of Parameter Variance (P) matrix)
Orientation entropy
KF Residuals
KF Scalar length residuals
Estimated covariance ratios
Magnitude of CL offsets used to modify thresholds Each of the metrics is described in detail below:

Estimated Variance

Embodiments of the invention determine the diagonal elements of the a posteriori covariance matrix. If the elements are below a tight threshold (small variance) then the estimated states may be considered reliable. The covariance matrix may not represent the actual errors in the state estimate. In the current model, the P matrix may be over-optimistic. Though it may be useful to have several measurements, not every measurement may contribute to improving the state estimation. The diversity in motion may help in convergence, however the model may not account for this aspect explicitly. Thus, P elements may decrease even if the phone position is very similar to the previous positions. As an example, if the computing device 2000 is in the same orientation all the time, the terms in P will decrease (at a very slow rate). But, over a long period of time, the results might have a small variance, but in reality the state may have been estimated by using only one unique position.

The Kalman Filter does not know if the estimate is derived from unique positions or not since the model lacks this information. For instance, if there are 3 unique positions, and 6 unknowns (3 offsets, 3 scale factors) to be estimated, the Kalman Filter may not have the knowledge built-in to avoid such scenarios. Thus, this information may be coded externally in the form of orientation entropy and monitored using Kalman Filter as described in further detail below. Thus, using the error covariance terms as a metric to check convergence may be a desired, but may not a sufficient condition to declare 'calibration completed.'

Orientation Entropy

A calibration system for a plurality of sensors coupled to a device monitors the sensor input over time to calibrate the sensors. However, if a mobile device is in the same orientation over a long period of time, the results might have a small variance, falsely indicating good calibration results. In reality the state was estimated by using only one or very few unique orientations resulting in poor calibration parameters for the various sensors in the system.

A Kalman Filter used in such systems for filtering sensor measurements does not know if an estimate is derived from unique orientations or not since the model lacks this information. Thus, aspects of the invention encode this information externally in the form of orientation entropy (FIG. 11) and frequency binning (FIG. 12) and monitor the results from Kalman Filter.

One of the assumptions made in the algorithm may be that the measurements are independent and ideally obtained from independent phone positions. To this effect, there is no check done within the Kalman Filter to include the orientations covered as a part of the measurements. Thus, we do a check for the orientations covered (on a per axis basis) outside of the filter. The orientation angle may be determined as the inverse cosine of the ratio of the vector acceleration to the scalar acceleration as shown in:

$$\theta_x = \cos^{-1}\left(\frac{a_x}{acc_{scalar}}\right)$$

Embodiments of the invention maintain a histogram for each axis, and with fixed bins and covering the angles from 0 to 180 degrees. Whenever a new measurement may be received, the orientation histogram may be updated and corresponding probability of the orientation is updated. This may be done as shown in:

$$p_{\theta_x} = \frac{f_{\theta_x}}{\sum_1^{nbins} f_{\theta_x}}$$

Following this, the entropy of the orientation may be computed as shown in:

Error! Reference source not found.

Either the histogram counts or entropy could indicate the different orientations covered. By making sure that either one or both quantities are above a threshold, it may be determined if enough independent measurements have been used. Thus, this independent information will augment decision about the reliability of the estimated calibration parameters.

$$acc_{scalar} = \sqrt{a_x^2 + a_y^2 + a_z^2}$$

$$\theta_x = \cos^{-1}\left(\frac{a_x}{acc_{scalar}}\right)$$

$$f_{\theta_x} = \lfloor f_0 f_1 f_2 \ldots f_{nbins} \rfloor$$

$$p_{\theta_x} = \frac{f_{\theta_x}}{\sum_1^{nbins} f_{\theta_x}}$$

$$e_x = -\sum_1^{nbins} p_{\theta_x} \ln(p_{\theta_x})$$

Thus, before making a decision on publishing the results, the decision monitor ensures that enough diverse orientations have occurred. Both the maximum orientation entropy and the current entropy are used to make the decision. The decision is made by using a lower limit on the entropy.

Orientation Entropy Used in Different Blocks:

Loop Closure Condition: Orientation Entropy may be used as an additional criteria before loop closure (feedback). This is done to ensure that feedback is not started when very similar phone orientations occur. In some tests, we observed that feedback based on variance terms alone caused incorrect feedback. Including additional entropy criteria even for the first time the loop closes helps in filter stability Partial Rest of P Matrix: The Entropy number may characterize the diversity in the data. Entropy may be used to modify P when loop closure is done—additional term is added to reset the P to a large value for the very first time of loop closure:

$$P_k(1, 1) = P_k(1, 1) * \left(1 + \frac{1}{e_{k,x}}\right)$$

$$P_k(2, 2) = P_k(2, 2) * \left(1 + \frac{1}{e_{k,y}}\right)$$

$$P_k(3, 3) = P_k(3, 3) * \left(1 + \frac{1}{e_{k,z}}\right)$$

The increase in P may avoid the transients due to loop feedback or closure. At closure, the non-linearity errors are reduced considerably, and the model becomes more accurate.

Freezing P During Similar Positions: Orientation Entropy may be used to provide information on whether a position has changed or not, and avoid the decrease in P when the phone position does not change from the previous position:

$$P_k = \alpha P_{k-1} + (1-\alpha) P_k,$$

where $\alpha$ is 1 or 0 respectively, depending on whether the current orientation is equal to the previous orientation or not.

Figure 11:
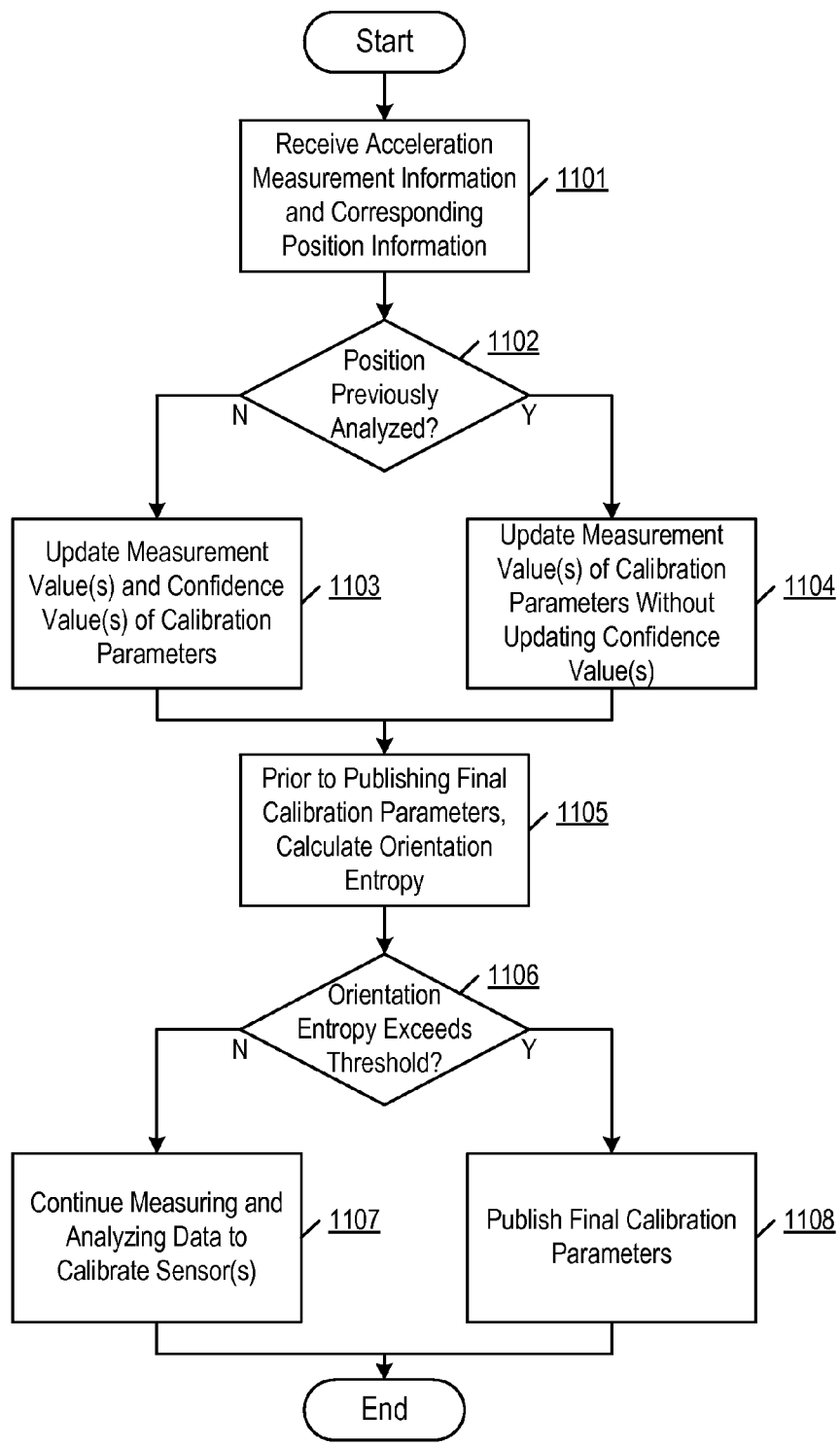
FIG. 11 illustrates a non-limiting example method of evaluating calibration measurements using orientation entropy according to one or more illustrative aspects of the disclosure.

FIG. 11 illustrates a non-limiting example method of evaluating calibration measurements using orientation entropy according to one or more illustrative aspects of the disclosure. The process 1100 is performed by processing logic that comprises hardware (circuitry, dedicated logic, etc.), software (such as is run on a general purpose computing system or a dedicated machine), firmware (embedded software), or any combination thereof. In one embodiment, the process 1100 is performed by one or more computer systems 2000 as described in FIG. 20. In one embodiment, the sensors 2050 acquire the sensor input for further processing by filtering and processing by components of the device described in FIG. 20. In one embodiment a Kalman Filter is may be used.

At block 1101, a plurality of sensor calibration measurements, such as accelerometer measurements, and corresponding position/orientation information may be received (e.g., by computing device 2000 and/or one or more processors 2010 included therein from one or more accelerometers and/or other sensors included at computing device 2000). For illustration purposes, accelerometers are discussed, however, other sensors may be used in embodiments of the invention. At block 1102, the one or more processors 2010 may determine whether the received sensor calibration measurements associated with the position/orientation has been previously analyzed.

If the sensor calibration measurements associated with the position/orientation has not been previously analyzed, then at block 1103, one or more sensor calibration measurement values and one or more confidence values of one or more calibration parameters may be updated. On the other hand, if the position has been previously analyzed, then at block 1104, one or more sensor calibration measurement values of one or more calibration parameters may be updated without updating one or more confidence values of the one or more calibration parameters.

Subsequently, at block 1105, prior to publishing final calibration parameters, the one or more processors 2010 may calculate the orientation entropy, to determine a degree to which the plurality of calibration measurements were obtained at different orientations. At block 1106, the one or more processors 2010 may determine whether the calculated orientation entropy exceeds a threshold. If the one or more processors 2010 determine that the orientation entropy does not exceed a threshold, then at block 1107, the device may continue measuring and analyzing data to calibrate one or more sensors. In one embodiment, in response to determining that the orientation entropy is below a predetermined threshold, the processor 2010 may discard a sensor calibration measurement for an orientation for which a sensor calibration measurement has been previously received without updating the one or more calibration parameters. In another embodiment, the sensor calibration measurement for an orientation may be used, by the processor 2010, for reducing noise in the sensor calibration measurements without updating the one or more calibration parameters. On the other hand, if it is determined that the orientation entropy does exceed the threshold, then at block 1108, the final calibration parameters may be published by the one or more processors 2010.

It should be appreciated that the specific steps illustrated in FIG. 11 provide a particular method of switching between modes of operation, according to an embodiment of the present invention. Other sequences of steps may also be performed accordingly in alternative embodiments. For example, alternative embodiments of the present invention may perform the steps outlined above in a different order. To illustrate, a user may choose to change from the third mode of operation to the first mode of operation, the fourth mode to the second mode, or any combination there between. Moreover, the individual steps illustrated in FIG. 11 may include multiple sub-steps that may be performed in various sequences as appropriate to the individual step. Furthermore, additional steps may be added or removed depending on the particular applications. One of ordinary skill in the art would recognize and appreciate many variations, modifications, and alternatives of the process.

Figure 12:
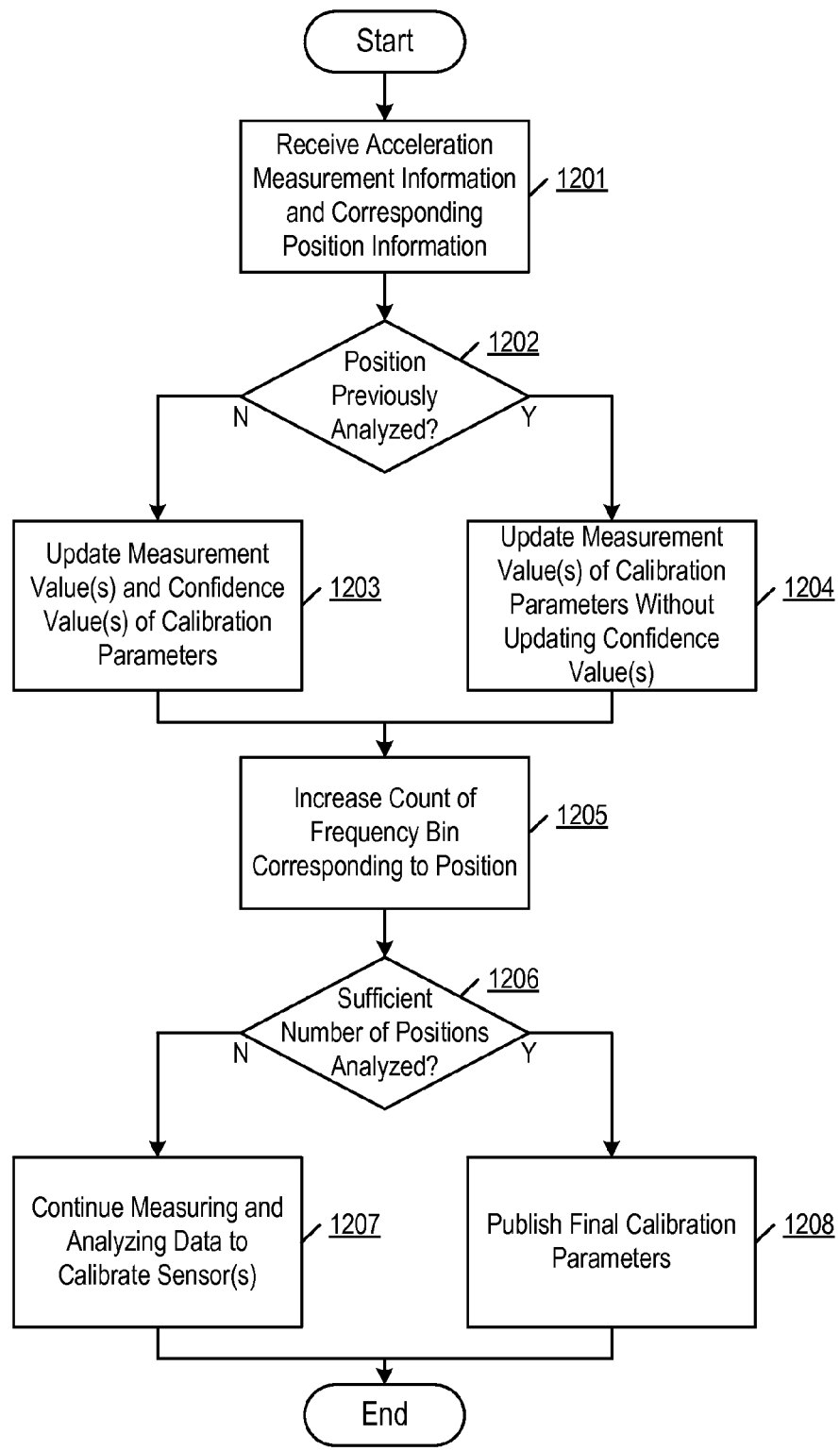
FIG. 12 illustrates a non-limiting example method of evaluating calibration measurements using frequency binning according to one or more illustrative aspects of the disclosure.

FIG. 12 illustrates a non-limiting example method of evaluating sensor calibration measurements using frequency binning according to one or more illustrative aspects of the disclosure. The process 1200 is performed by processing logic that comprises hardware (circuitry, dedicated logic, etc.), software (such as is run on a general purpose computing system or a dedicated machine), firmware (embedded software), or any combination thereof. In one embodiment, the process 1100 is performed by one or more computer systems 2000 as described in FIG. 20. In one embodiment, the sensors 2050 acquire the sensor input for further processing by filtering and processing by components of the device described in FIG. 20. In some embodiments a Kalman Filter may be used.

At block 1201, a plurality of sensor calibration measurements, such as acceleration measurement information and corresponding position information may be received (e.g., by computing device 2000 and/or one or more processors included therein from one or more accelerometers and/or other sensors included in computing device 2000). For illustration purposes, accelerometers are discussed, however, other sensors may be used in embodiments of the invention. At block 1202, it may be determined whether the position has been previously analyzed.

If the position has not been previously analyzed, then at block 1203, one or more measurement values and one or more confidence values of one or more calibration parameters may be updated. On the other hand, if the position has been previously analyzed, then at block 1204, one or more measurement values of one or more calibration parameters may be updated without updating one or more confidence values of the one or more calibration parameters.

Subsequently, at block 1205, the count of a frequency bin corresponding to the position may be increased. For example, bins may be assigned to 0° to 360° in five degree increments, such that any position falling within a particular increment increases the count for that increment's "bin." In this way, the variety of positions being analyzed can be tracked, as described above.

At block 1206, the processor may determine whether a sufficient number of positions have been analyzed. If it is determined that a sufficient number of positions have not been analyzed, then at block 1207, the device may continue measuring and analyzing data to calibrate one or more sensors. In one embodiment, in response to determining that a sufficient number of positions have not been analyzed, the processor 2010 may discard a calibration measurement for an orientation for which a calibration measurement has been previously received without updating the one or more calibration parameters. In another embodiment, the calibration measurement for an orientation may be used, by the processor 2010, for reducing noise associated with the calibration measurements without updating the one or more calibration parameters. On the other hand, if it is determined that a sufficient number of positions has been analyzed, then at block 1208, the final calibration parameters may be published (e.g., as described above).

It should be appreciated that the specific steps illustrated in FIG. 12 provide a particular method of switching between modes of operation, according to an embodiment of the present invention. Other sequences of steps may also be performed accordingly in alternative embodiments. For example, alternative embodiments of the present invention may perform the steps outlined above in a different order. To illustrate, a user may choose to change from the third mode of operation to the first mode of operation, the fourth mode to the second mode, or any combination there between. Moreover, the individual steps illustrated in FIG. 12 may include multiple sub-steps that may be performed in various sequences as appropriate to the individual step. Furthermore, additional steps may be added or removed depending on the particular applications. One of ordinary skill in the art would recognize and appreciate many variations, modifications, and alternatives of the process.

Residuals

The residual or measurement innovation of the Kalman Filter has also been described above. Large residuals indicate the need for correction to the predicted measurements (based on past measurements). Thus, as more and more measurements are processed, the expectation is that the residuals will become smaller. If the residuals are small it generally reflects a good estimate. We inspect the innovations vector for large entries and use it as an indication that the results are not reliable yet.

The Kalman Filter assumes white noise in the measurements. The current measurement noise may be correlated. In addition, non-linearity in the model could to non-zero residuals. But, as the calibration progresses, and the estimated offsets become more accurate, the residuals become smaller. Ideally, the mean of the residuals should be equal to zero.

This Kalman Filter model may be non-optimal, and may not provide residuals with zero mean due to some or all of the following factors: (1) Non-linearity; (2) Unmodelled variables/states; (3) Correlated noise; and (4) Ignoring the diversity in positions. In one implementation, the residual threshold may be 50 mg$^2$, and the standard deviation may be 30 mg$^2$. Embodiments of the invention may set a bound in some instances on the standard deviation in order to increase the robustness of the estimate and ensure that the filter reaches a steady state error.

Scalar Length Residuals

Both the residual and scalar should be equivalent. In one implementation, where the residual is deduced in mg$^2$ the scalar length may be calculated to compare the scalar acceleration lengths (mg) and the residual as follows:

$$\text{residual\_scalar} = \sqrt{Z_k + G^2} - \sqrt{H_k X_k + G^2}$$

Estimated Covariance Ratios

The ratio of the variance to the covariance terms is also used to check for possible state coupling. The covariance matrix is shown in equation below. In one embodiment, the ratio of the state variance term to the covariance term (4 ratios/state) may be used and may not publish the results until the ratio is greater than 1. This may imply that the covariance terms are smaller than the state variance. This metric may provide an indication of the quality of convergence of each of the states with respect to the other states.

$$P_k = \begin{bmatrix} v_{xoff} & c_{xyoff} & c_{xzoff} & c_{xoffsf} & c_{xoffysf} & c_{xoffzsf} \\ c_{xyoff} & v_{yoff} & c_{yzoff} & c_{yoffxsf} & c_{yoffsf} & c_{yoffzsf} \\ c_{xzoff} & c_{yzoff} & v_{zoff} & c_{zoffxsf} & c_{zoffysf} & c_{zoffsf} \\ c_{xoffsf} & c_{yoffsf} & c_{zoffxsf} & v_{xsf} & c_{xysf} & c_{xzsf} \\ c_{xoffysf} & c_{yoffsf} & c_{zoffysf} & c_{xysf} & v_{ysf} & c_{yzsf} \\ c_{xoffzsf} & c_{yoffzsf} & c_{zoffsf} & c_{xzsf} & c_{yzsf} & v_{zsf} \end{bmatrix}$$

For example, in one embodiment, for x-axis offsets following conditions may be checked:

$$\frac{v_{xoff}}{c_{xyoff}} > 1$$

AND $$\frac{v_{xoff}}{c_{xzoff}} > 1$$

AND $$\frac{v_{xsf}}{c_{xysf}} > 1$$

AND $$\frac{v_{xsf}}{c_{xzsf}} > 1$$

Closed Loop Offset Magnitudes

If the observed closed loop offsets are large, it may indicate a large initial offset or scale factor in the data. Thus, obtaining large closed loop results could be used to gauge the impact of non-linearity. Also, according to experiments, nearly half of the error may be corrected by performing loop closure during feedback. Thus, the magnitude of the closed loop estimate may be used to set the threshold windows for computing the residual mean and standard deviations. For final decision, the threshold on each metric may need to be satisfied.

3D Histogram Accelerometer Binning

In one embodiment, the incoming sensor calibration measurements from the sensors may be saved in a 3D histogram and input to the Kalman Filter periodically to avoid the decrease in covariance matrix due to repetitive similar positions. This may be an extension of the procedures described above in respect to FIG. 10 and FIG. 11. Every measurement in the orientation bin may be averaged with measurements in the same bin. Thus, each orientation bin may be used as an input to the Kalman Filter only once. This may be advantageous in avoiding under-estimation of P.

Algorithm Design Considerations

Feedback to Avoid Non-Linearity

In an exemplary simplified model, the estimated offsets and the scale factors may be assumed to be linearly related to the measurements. However, in reality, the relationship is non-linear and using such a simplified model has its implications in the form of performance. Specifically, if the estimated offsets and scale factors are large (100 mg or 5% and over), the estimate errors could be significant.

In order to reduce errors due to non-linearity, the intermediate estimates may be applied to the incoming raw accelerometer data. By applying the intermediate results and 'closing the loop' the new estimates may be smaller (since the data is partially corrected). This feedback loop may be designed on the basis of the estimated parameter standard deviations. It is desirable that the estimated parameters standard deviations are accurate and reliable in order to avoid instability in feedback. Other considerations when closing the loop may be to avoid transients in the residuals, and re-initialize the state vector to zeros and possibly the variances to a higher value. According to experimental data, no feedback may increase the errors in offset to 50 mg or more. And applying feedback resulted in the error in all the axes reducing below 20 mg. Thus, closing the loop correctly can result in improved performance.

Normalizing the H Matrix

By normalizing the H matrix with magnitude of gravity, the scale factor non-linearity may be reduced. This is because the slope is now normalized, and the effects of large offsets are reduced. The observation matrix may be modeled as shown:

$$H_k(1:3) = G * H_k(1:3) / \sqrt{H_k(1)^2 + H_k(2)^2 + H_k(3)^2} \quad 19$$

$$H_k(4:6) = G^2 * H_k(1:3) / (H_k(1)^2 + H_k(2)^2 + H_k(3)^2) \quad 20$$

Lower Bound on Measurement Variance ("R")

The measurement variance may be computed as a function of the variances on individual axes. In addition, the variance computation reliability depends on the length of the stationary period. For short segments, the estimated variance may not be reliably calculated. For long segments, it is possible that the variance is reduced to a very small value, and hence underestimated. To avoid these scenarios, a lower bound may be used on both the individual axes variance as well as the average variance over the length of the stationary segment. These bounds may be designed based on sensor noise, quantization and resolution errors.

Lower Bound on Estimated Parameter Variance ("P Matrix")

In general, greater number of stationary segments processed by the Kalman Filter tend to yield better state estimates. Thus, the variance becomes small after several stationary segments are processed. In order to avoid the values from becoming very small or close to zero, a lower bound on the variance may be created by embodiments of the invention. In some instances, this may be necessary since neither the measurements nor the estimated parameters may be assumed to be perfectly modeled or computed. In addition, when the variances of the predicted values are small, the new measurements may be incorporated with smaller weights. This may be detrimental since new measurements could potentially allow for any slow changes or transitions in the offset and scale factor errors.

The variance may have natural limits based on factors like noise floor, quantization and resolution errors in the sensors etc. Since the model does not explicitly account for these errors, an artificial lower bound on the variance may be used. In addition, when the results are ready to be published to the external client, embodiments of the inventions may avoid providing unrealistic or over optimistic variances by scaling the values if needed.

Proper Initialization of the State Vector and Their Variances

In some implementations, the initial estimates provided to the Kalman Filter may be chosen as accurately as possible and the initial offset and scale factor may be assumed to be zero. The error variances for offsets may be initialized to (30 mg)^2, and (3%)^2 for scale factors. In some implementations, the initializations may also incorporate information from sensor specifications to further improve results.

Storing "Good" Measurements for Verification

Some fixed numbers of good measurements that may be determined from different orientations may be stored in the registry for later use. This set of saved measurements may be used to reduce non-linearity as well as add robustness to the algorithm. The measurements may be stored in circular buffers, and the window size may be determined based on the memory 635 availability in the registry. The decision on whether a measurement should be stored or not may be based on the following criteria:

Orientation Frequency Bins

The orientation frequency bins are maintained on a per axis basis. The bin width may be set to 30 degrees and a range of 0 to 180 degrees is covered. The frequency vector is updated each time a new measurement is received. In one implementation, a fixed number of positions may be accumulated in each bin in order to have diverse measurements for each axis. Some implementation may be in the form of a moving window of size 10.

Vertical or Horizontal Acceleration Positions

When the axes are aligned to horizontal or vertical (aligned to gravity or away from gravity), the measurements may be saved for future use, in memory 635 or any other storage area. This may ensure that positions helpful in converging the calibration data are stored. Also, measurements are automatically stored if the user performs the 6-position manual calibration tests. Ideally the buffered data should be processed whenever there is an opportunity to do so without affecting the power consumed, and hence expedite convergence during 6-position tests.

High Change in Orientation Entropy

If the orientation entropy gradient (current entropy–previous entropy) for any axis is greater than the maximum orientation entropy encountered so far, the measurement may be stored in the registry. The measurements may be stored when any of the above conditions (i.e. if the orientation is unique, or if any axis is aligned to gravity or it has high entropy compared to history) are met, and without repetitions. The storage may be performed separately for each temperature range. The calibration algorithm should process the stored measurements whenever there is minimum effect on power consumption. For e.g. during charging, or when phone is in high power mode.

Behavior During Continuous Stationarity

During long periods of stationary data or near stationary data, the measurements are redundant and do not help much in the state estimate convergence. But, the covariance matrix reflects otherwise. This issue of over-optimistic covariance estimates has been discussed above. The algorithm behavior during three possible cases is described below:

Long Stationary Periods (Charging)

The accelerometer data averaging may begin when stationarity is detected and the averaging may continue until either the i) end of stationarity or the ii) maximum limit on the number of samples averaged is reached. Averaging of data may start back up on detection of motion or change in temperature. In other words, the measurement may be regarded as a new update and may be used for the appropriate temperature bin.

Non-Observable Axis

In situations where there is periodic motion continuously about one axis (making the axis errors not observable), and there may be continuous motion about the other 2 axes, the stationary detection may not capture the motion involved. This could result in a decrease in the estimated covariance matrix which may lead to an overly optimistic P. It may be detected that one axis is continuously falling in the same bin by monitoring the frequency bins. If this happens on either of the axes, the measurement may be used in the state estimate, but the P matrix may not be decreased. Thus, the benefit of having redundant positions may be incorporated in the state estimate (noise reduction), but the P may be prevented from reflecting this.

P Reset During First Loop Closure

Feedback may be applied to mitigate the effects of non-linearity in the model. When the estimated parameters are applied to the incoming accelerometer data, the non-linearity may be reduced considerably leading to a more accurate model. Thus, until loop closure, the state estimate may be used to help in model error reduction. The covariance terms may already be low (due to the already processed measurements to attain closure), and may need to be reset to high values to reflect a new start of the calibration process. The P may be reset to the initialization value or reset based on orientation entropy achieved until closure for the first time. If P is reset to a very large initial value, the estimates obtained may be discarded and it may be equivalent to starting calibration afresh. Thus, P may be reset based on orientation entropy that captures how many unique positions have been received by the filter. This may prevent very long calibration times, and capture the filter history accurately.

Filter Reset During Impossible Values

In some embodiments, the estimated states may be monitored and if the offsets are larger than 500 mg in open or closed loop or scale factors greater than 40%, the filter may be reset to the initial state. High thresholds may be used because if the real offsets and scale factors are high, the open loop results may have a large error due to non-linearity. The cause of error may be attributed to either incorrect Kalman Filter estimation due to lack of diverse positions or sensor faults. In either case, the filter may be reset.

Lower Bound on Orientation Entropy

The orientation entropy can become small if the same orientation is repeated too often compared to others. Thus, a minimum orientation entropy threshold is used to avoid very low values of entropy during P reset at the time of closure.

Number of Outliers Monitoring

An outlier measurement may be defined as a measurement that causes the filter residual to become abruptly high. In theory, error residuals have a zero mean and a small standard deviation. In practice, the residuals can have non-zero mean and are large initially. As more and more measurements are processed, and the loop closure occurs these residuals may become small. After gaining confidence in the filter performance (i.e. after the first set of results are published by the decision monitor), increase in residuals could indicate issues in the filter operation. If several measurements in recent past cause the error residuals to be larger than k*error covariance (3 sigma tests), it could be indicative of one of the following:

1. Faulty sensors—Drift of the estimated parameters, spikes in data, etc.
2. Feedback error—Errors propagated due to incorrect feedback
3. Filter divergence—for an unknown reason or instability, the estimated parameter diverges In the event of detecting such behavior after the results are published, the algorithm may reset the filter state to the values estimated during the first publishing.

Residuals Before and After Loop Closure

The moving average error residuals are monitored before and after loop closure. If the residual errors increase after closure, this may indicate incorrect feedback. The filter is then re-initialized to the state before loop closure, and the algorithm may resume processing new accelerometer data.

Figure 13:
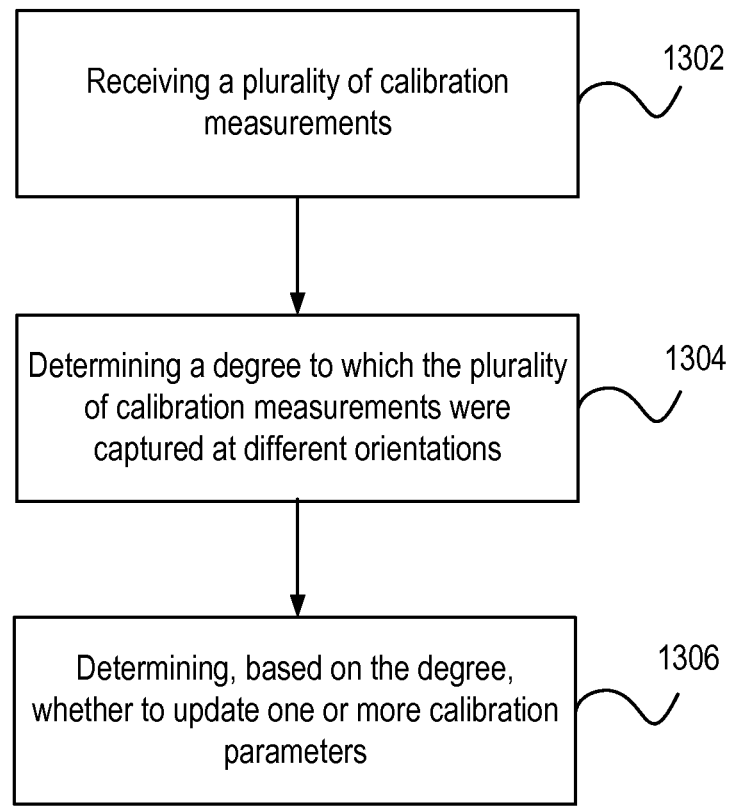
FIG. 13 is a simplified flow diagram illustrating a non-limiting method performed by embodiments of the invention for scheduling an execution of a task on a computing device.

FIG. 13 is a simplified flow diagram illustrating a non-limiting method performed by embodiments of the invention for scheduling an execution of a task on a computing device 2000. The process 1300 is performed by processing logic that comprises hardware (circuitry, dedicated logic, etc.), software (such as is run on a general purpose computing system or a dedicated machine), firmware (embedded software), or any combination thereof. In one embodiment, the process 1300 is performed by one or more computing devices 2000 as described in FIG. 20.

Referring to exemplary FIG. 13, at block 1302, components of the device performing embodiments of the invention may receive a plurality of calibration measurements. In one embodiment, determining a degree to which the plurality of calibration measurements were captured at different orientations may include binning each of the plurality of calibration measurements into at least one orientation bin of a plurality of orientation bins. In one implementation, each orientation bin of the plurality of orientation bins corresponds to orientation measurements captured within a predetermined degree increment (e.g., 5 degree increment). In another embodiment, determining the degree may comprise calculating an entropy indicative of a range or variance of orientations at which the calibration measurement were captured. In yet another embodiment, orientation histograms may be used to gauge the diversity of the calibration data. The one or more calibration parameters may be updated using a filter. In one implementation, the filter may be a Kalman Filter.

At block 1304, embodiments of the invention may determine a degree to which the plurality of calibration measurements were captured at different orientations. In one embodiment, determining the degree to which the plurality of calibration measurements were captured at different orientations may comprise calculating an orientation entropy value for a plurality of measurements. And at block 1306, embodiments of the invention may determine, based on the degree, whether to update one or more calibration parameters.

In one implementation, in response to determining that the orientation entropy exceeds a predetermined threshold, embodiments of the invention determine to update the one or more calibration parameters. In one implementation, in response to determining that the orientation entropy is below a predetermined threshold, embodiments of the invention discard the captured measurement without updating the one or more calibration parameters. In another implementation, in response to determining that the orientation entropy is below a predetermined threshold, embodiments of the invention may use the captured measurement for reducing the noise in the captured measurements without updating the one or more calibration parameters.

It should be appreciated that the specific steps illustrated in FIG. 13 provide a particular method of switching between modes of operation, according to an embodiment of the present invention. Other sequences of steps may also be performed accordingly in alternative embodiments. For example, alternative embodiments of the present invention may perform the steps outlined above in a different order. To illustrate, a user may choose to change from the third mode of operation to the first mode of operation, the fourth mode to the second mode, or any combination there between. Moreover, the individual steps illustrated in FIG. 13 may include multiple sub-steps that may be performed in various sequences as appropriate to the individual step. Furthermore, additional steps may be added or removed depending on the particular applications. One of ordinary skill in the art would recognize and appreciate many variations, modifications, and alternatives of the process.

Figure 14A:
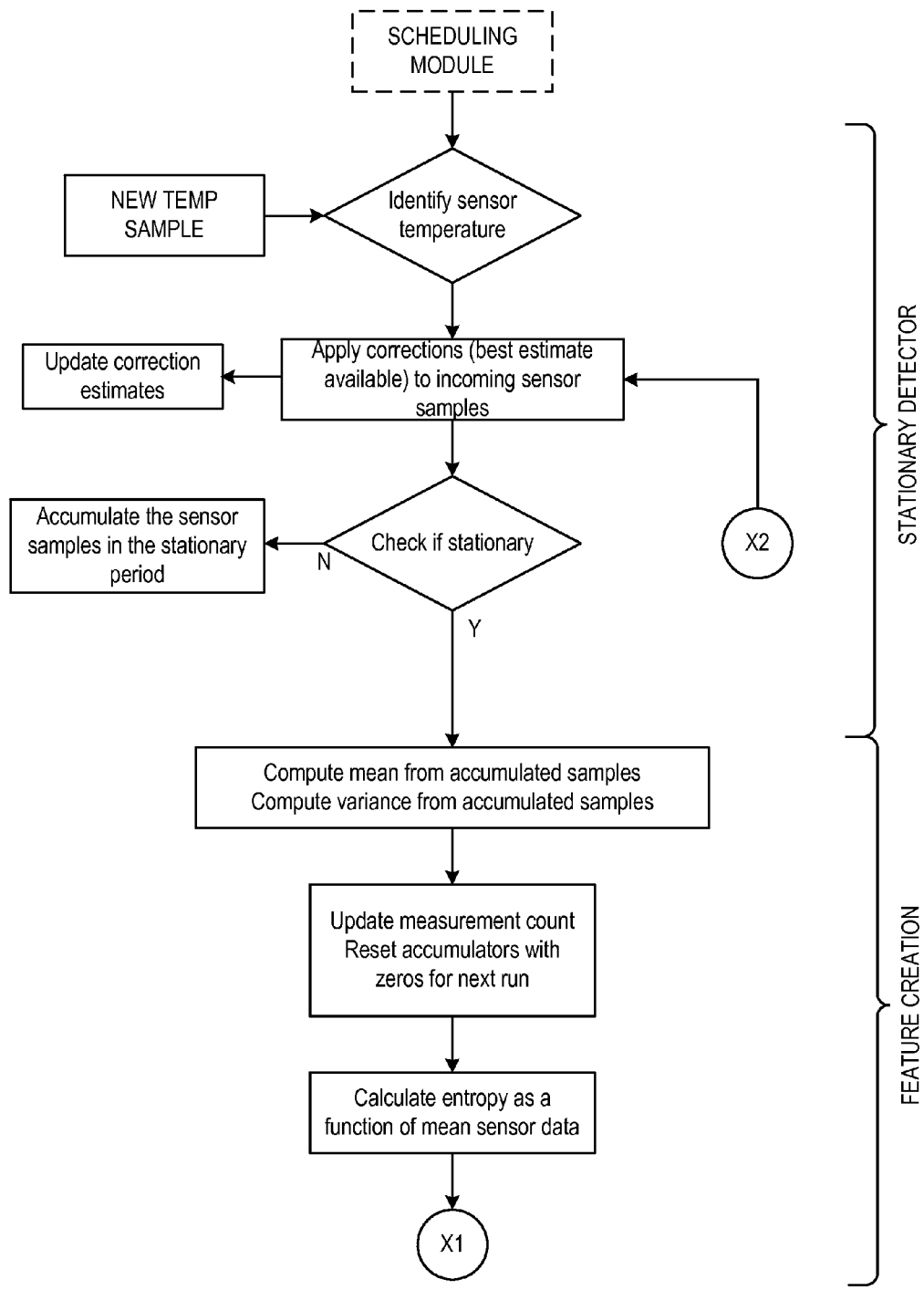
FIGS. 14A-14C illustrate various aspects of the example calibration method in greater detail according to one or more illustrative aspects of the disclosure.
Figure 14B:
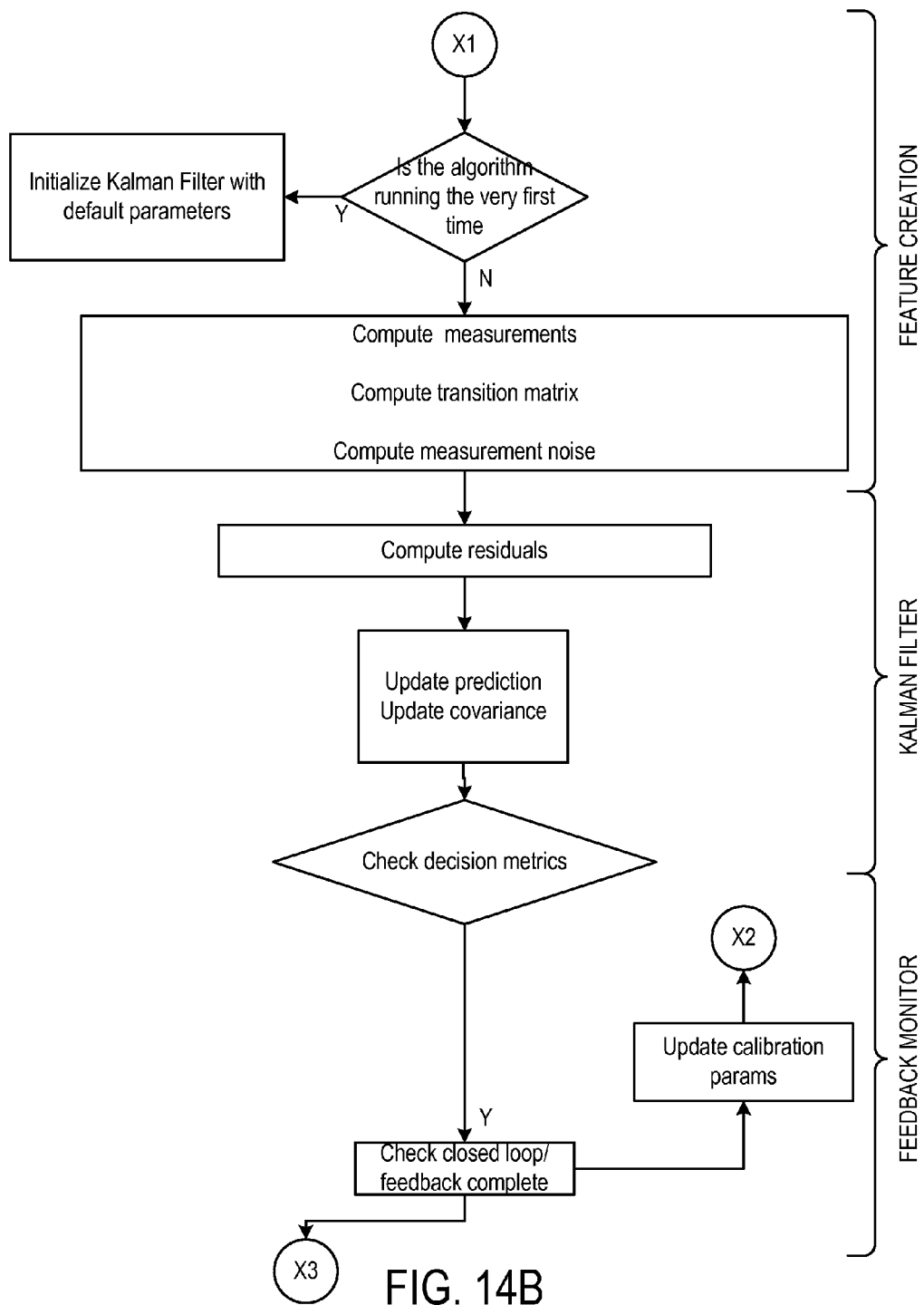
Figure 14C:
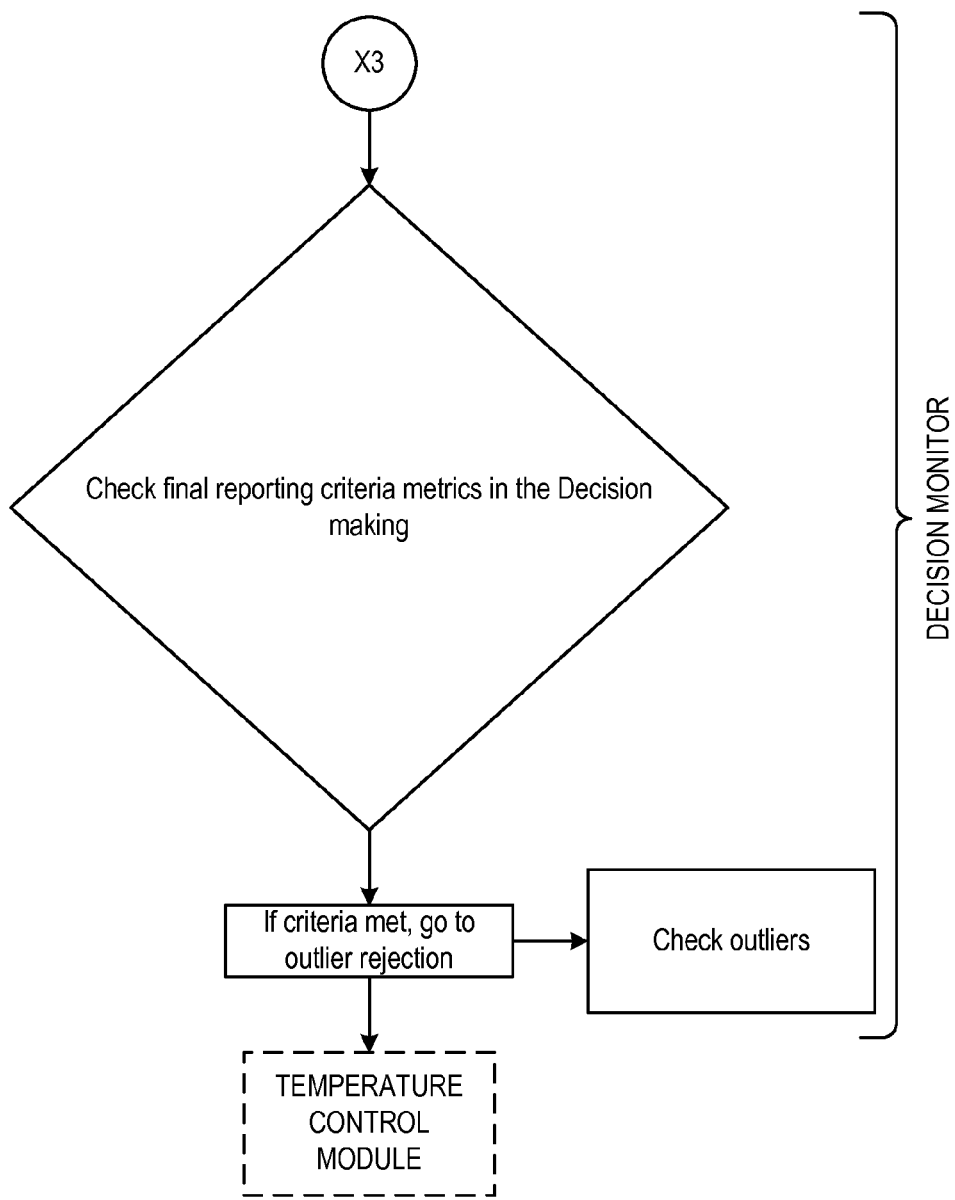

FIGS. 14A-14C illustrate various aspects of the example calibration method in greater detail according to one or more illustrative aspects of the disclosure. Various portions of the example calibration method illustrated in these figures will be described in the following passages. As discussed in additional detail herein, the steps of the method illustrated in FIGS. 14A-14C may be performed by the calibration module 410, and each of the identified elements in these figures may be implemented as a sub-module or element within the calibration module.

Stationary Detection:

This module establishes whether a sample is part of a stationary period or not. The criteria used to determine stationarity might be based on accelerometer data only. Stationarity may be established as part of the auto-calibration algorithm by putting an upper bound on the accelerometer norm, standard deviation or the vector gradient of the accelerometer magnitude. It may be desirable that the information is available on a per sample basis, since embodiments of the invention may rely on fixed length stationary segments, and maintain a moving sum of the samples till the end of a stationary period. It is understood that there could be delays involved in the signaling depending on the window size used to establish stationarity. It would therefore be advantageous to know when the state changes from STATIONARY to MOTION in order to avoid using samples that are part of the motion. The algorithm discards some samples from the beginning and the end of the stationary period retroactively to avoid the above problem.

In addition, for the auto-calibration algorithm absolute stationarity might not be essential. In fact, in some scenarios, using absolutely stationary segments may delay the algorithm convergence. Embodiments of the invention rely on data during 'regular usage' of the phone to calibrate automatically without knowledge of phone orientation. For example, holding the phone during a call, dialing, looking at the display, in pocket while sitting or standing, etc. are all motion types that can be used for calibration. Thus, stationarity may include substantially stationary positions for embodiments of the invention discussed herein and stationarity may be used in a 'loose' sense, in order to avoid long calibration times.

II-B. Data Processing and Feature Creation

Transforming input data into the set of features is called feature extraction. Feature extraction may be used to reduce the amount of data presented to an algorithm. For auto-calibration, the feature extraction scheme may involve computing the: mean and variance of vector acceleration, scalar acceleration, measurement as the difference in the scalar acceleration and Gravity, and finally measurement variance as a function of the vector acceleration variance.

Mean & Variance Computation:

If the incoming samples are determined to be part of the current stationary segment, the sample may be incorporated into the segment mean and variance computation. Each stationary segment may typically consist of several samples.

If a stationary segment is assumed to have n samples, the mean and the average variance of the data may be calculated as shown below:

$$a_x = \frac{1}{n}\sum_{i=1}^{n} a_{x,i} \tag{1}$$

$$a_y = \frac{1}{n}\sum_{i=1}^{n} a_{y,i} \tag{2}$$

$$a_z = \frac{1}{n}\sum_{i=1}^{n} a_{z,i} \tag{3}$$

The variance on each of the axes may be calculated as:

$$\sigma_x^2 = \frac{1}{n}\sum_{i=1}^{n} (a_{x,i} - a_x)^2 \tag{4}$$

$$\sigma_y^2 = \frac{1}{n}\sum_{i=1}^{n} (a_{y,i} - a_y)^2 \tag{5}$$

$$\sigma_z^2 = \frac{1}{n}\sum_{i=1}^{n} (a_{z,i} - a_z)^2 \tag{6}$$

A recursive implementation of the mean and variance may be used in order to avoid buffering the samples. A minimum and a maximum limit on the number of samples that belong to the same stationary segment may be used. The minimum limit on number of samples may be desirable in order to compute variance reliably. The limit on the maximum number of samples may be used to avoid summing data for long periods to prevent overflows.

Measurement Computation

The measurement may be defined as the difference between the magnitude of the mean acceleration and gravity. To avoid the square root operation, the squared magnitude difference may be used. The measurement may be defined as:

$$z = a_x^2 + a_y^2 + a_z^2 - g^2 \tag{7}$$

Here, $a_x$, $a_y$ and $a_z$ are the mean acceleration on each axis computed as shown in the previous section. This measurement may be modeled in terms of offsets and scale factors as:

$$z = (x_0(1+x_{SF}) + x_{OFF})^2 + (y_0(1+y_{SF}) + y_{OFF})^2 + (z_0(1+z_{SF}) + z_{OFF})^2 - g^2 \tag{8}$$

where $x_0$ is the true acceleration, $x_{SF}$ is the scale factor error in the x acceleration. $x_{OFF}$ is the offset error in the x acceleration. Similar notation may be used for the y and z axes.

Measurement Variance Computation

The variance of the mean of the measurement 'z' can be modeled as shown below:

$$\text{var}(z) = \text{var}(a_x^2 + a_y^2 + a_z^2 - g^2)$$
$$= \text{var}(a_x^2) + \text{var}(a_y^2) + \text{var}(a_z^2)$$

assuming that the accelerations of the 3 axes are uncorrelated. From the propagation of uncertainty [R3], a relationship between $\text{var}(a_x)$ and $\text{var}(a_x^2)$ can be established.

Consider a real random variable A, with standard deviation $\sigma_A$, and a, b are real-valued constants. The variance of a function $f=A^{+b}$ in terms of the variance of the real variable may be given by:

$$\frac{\sigma_f}{f} = b\frac{\sigma_A}{A}$$

In one scenario, b=2 and hence $f=a_x^2$. Thus, $\text{var}(a_x^2)=4a_x^2\sigma_x^2$. Similarly, $\text{var}(a_y^2)=4a_y^2\sigma_y^2$ and $\text{var}(a_z^2)=4a_z^2\sigma_z^2$. Thus, the variance of the measurement in terms of the component variances may be calculated as:

$$\text{var}(z)=4a_x^2\sigma_x^2+4a_y^2\sigma_y^2+4a_z^2\sigma_z^2 \quad (9)$$

II-C. Kalman Filter Design

The Kalman Filter may be an estimator for obtaining the instantaneous state of a linear dynamic system perturbed by white noise. This may be done by using measurements linearly related to the state but corrupted by white noise. Kalman Filter is may be used to estimate the offsets and scale factors recursively. The details of the Kalman Filter working and design are given below.

Generalized System Model

In the state-space model, a discrete time system is often represented by the equation shown below:

$$x_k = a_k x_{k-1} + b u_k + w_{k-1}, \quad (40)$$

where the following terminology may be used:
$x_k$ denotes the system state and can be a vector,
k denotes the time,
$a_k$ and b are constants,
$u_k$ denotes the control input, and
$w_k$ denotes the process noise.
The process noise may be assumed to be white, with 0 mean and covariance Q and uncorrelated with the input.

$$p(w)=N(0,Q)$$

Now, in one scenario, it may be difficult to determine the signal of interest x directly, and the measured value z is a linear function of x as shown below:

$$z_k = H x_k + v_k \quad 10)$$

Here, H is the observation matrix or the gain matrix and $v_k$ is the measurement noise. The noise may be assumed to be white with 0 mean and covariance, and may be uncorrelated with the input or the process noise.

$$p(v)=N(0,R)$$

Given a linear system as described above, the Kalman Filter filters z so as to estimate x, while minimizing the effects of noise w & v. The Kalman Filter simply reproduces the system model and uses the error between the current measurement and the predicted value (based on previous measurements) to correct the estimates.

Figure 15:
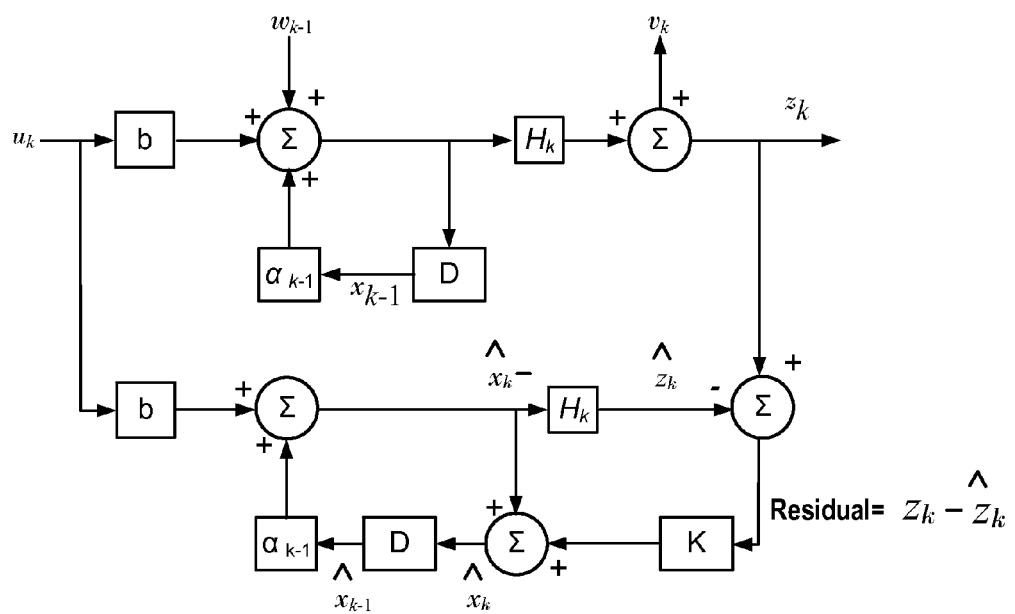
FIG. 15 illustrates an example of a Kalman Filter according to one or more illustrative aspects of the disclosure.

FIG. 15 illustrates an example of a Kalman Filter according to one or more illustrative aspects of the disclosure.

Simplified Model for Auto-Calibration Algorithm

Following assumptions may be made in one scenario: $a_k=1$, $u_k=0$, $w_k=0$. Thus, the linear system model may be reduced to the following equations:

$$x_k = x_{k-1} \text{ with dimensions } 6 \times 1$$

$$z_k = H x_k + v_k \text{ with dimensions } 1 \times 1 \text{ and } H \text{ has dimensions—} 1 \times 6$$

$$p(v)=N(0,R_k)$$

z is the measurement computed from equation $$z = a_x^2 + a_y^2 + a_z^2 - g^2$$

Here, $R_k$ is the variance of the measurement $z_k$ and may be computed as shown in equation (9).

In simple terms, the estimate of the last state is the current state and there may be no control input or process noise in our system. The process noise is assumed to be non-zero when the estimated parameters vary with time. The offsets and scale factors may be assumed to be constant with time, and may vary only due to temperature. The temperature compensation scheme may be designed outside of the Kalman Filter and thus may assume no process noise. The details on temperature compensation may be described below.

State Vector

The state vector consists of the parameters to be estimated namely, the offsets and scale factors on all 3 axes.

The state vector may be, $$x = \begin{bmatrix} x_{OFF} \\ y_{OFF} \\ z_{OFF} \\ x_{SF} \\ y_{SF} \\ z_{SF} \end{bmatrix} \quad (12)$$

Observation Matrix

A linear relationship may be assumed between the estimated states and the measurement. H may be the transition matrix and may be comprised of partial derivatives of the measurement with respect to the estimated state. Since in this case x and z are 6*1 and 1*1 vectors, the H matrix dimensions are [6*1]. Using z modeled as shown in equation (8), the partial derivatives may be calculated with respect to the states shown below:

$$\partial z/\partial x_{OFF} = 2x_0(1+x_{SF}) + x_{OFF} \sim 2a_x$$

$$\partial z/\partial y_{OFF} = 2z_0(1+y_{SF}) + y_{OFF} \sim 2a_y$$

$$\partial z/\partial z_{OFF} = 2z_0(1+z_{SF}) \pm z_{OFF} \sim 2a_z$$

$$\partial z/\partial x_{SF} = 2(x_0(1+x_{SF}) + x_{OFF}) \cdot x_0 \sim 2a_x^2$$

$$\partial z/\partial y_{SF} = 2(y_0(1+y_{SF}) + y_{OFF}) \cdot y_0 \sim 2a_y^2$$

$$\partial z/\partial z_{SF} = 2(z_0(1+z_{SF}) + z_{OFF}) \cdot z_0 \sim 2a_z^2$$

$$H = [2a_x 2a_y 2a_z 2a_x^2 2a_y^2 2a_z^2] \quad 13)$$

Here, $a_x$, $a_y$, $a_z$ may be computed as shown in equations, and $$a_z = \frac{1}{n}\sum_{i=1}^{n} a_{z,i}().$$

Note that $x_0$ is the true acceleration, $x_{SF}$ is the scale factor error in the x acceleration, $x_{OFF}$ is the offset error in the x acceleration. Similar notation may be used for the y and z axes.

The relationship between the current state and the measurement may be related by the transition matrix H. The 3 offset related terms may be directly proportional to the average acceleration in the 3 axes i.e. the state may be affected or modified directly with the input acceleration, since the offsets are directly proportional to the acceleration magnitude on each axis. On the other hand, the scale factor terms (4th to 6th in the matrix) may vary proportionally to squared acceleration (approximately). Since scale is a multiplicative term to the acceleration, it may vary proportionally to the measurement (squared magnitude of acceleration).

The states might not vary linearly with the measurement, and the model may be inaccurate if the offset and scale factor errors are large. It may be desirable to reduce the non-linearity errors by closing the loop (using feedback) and by normalizing the H matrix, as discussed in more detail below.

Computing "R"

The variance of the measurement may be directly used as the noise in the Kalman Filter. In an alternative approach, the computed variance may be divided by the number of samples in the stationary period. The reduction in noise magnitude could be attributed to the large number of stationary samples in the segment. But, this could give highly optimistic results since averaging does not help mitigate the errors due to resolution. In general, the noise in the segments may be small owing to the stationarity condition. Thus, R equal to the variance of the measurement, may be used, as shown in Equation (9)

Prediction and Correction Phases

The Kalman Filter works in 2 steps:

Step 1—Time Update or Predictor Phase

The time update equations are responsible for projecting forward (in time) the current state and error covariance. Given the initial estimates $\hat{x}_{k-1}$ and $P_{k-1}$, this step may calculate the next estimate of the state based on the past measurements of the output. Here, a priori covariance matrix may be initialized to the variance of the initial state.

The a priori covariance may also be calculated as shown below.

$$\hat{x}_k^- = \hat{x}_{k-1} \quad (14)$$

$$\hat{P}_k^- = P_{k-1} \quad (15)$$

Step 2—Measurement Update or Correction Phase

In this step, an attempt may be made to correct the a priori estimate. The Kalman gain may be the blending factor that aims to minimize the a posteriori error covariance and may be used to refine the a priori estimate to give 'a posteriori' estimates as shown below:

$$K_k = \frac{P_k^- H^T}{H P_k^- (H P_k^- H^T + R)} \quad (16)$$

$$\hat{x}_k = \hat{x}_k^- + K_k(z_k - H\hat{x}_k^-) \quad (17)$$

The term $z_k - H\hat{x}_k^-$ is also called the measurement innovation or residual, since it reflects the discrepancy between the predicted and the actual measurement. The a posteriori covariance may be computed as:

$$P_k = (I - K_k H) P_k^- \quad 18)$$

Significance of Kalman Gain

If the a priori error is small, the gain K may be small, so the correction applied may be small. In other words, the current measurement may be nearly ignored and only past estimates form the new estimate. This is logical since if the a priori estimate is good, there is little need to correct it.

If the a priori error is large, the measurement noise term R may not be important, then K=1/H. Thus, the a priori estimate may be discarded and the current measurement may be used to estimate the state If the measurement noise R is large, K may be small so the current measurement may be ignored and the estimate may depend more on the past estimates II-D. Feedback Monitor The feedback monitor is the module that monitors the covariance matrix, per axis entropy and the residuals before using the estimated parameters in feedback. The feedback monitor checks the elements of the a posteriori covariance matrix (P) until the variance of the state estimate goes below a threshold. The condition may be checked for either all offsets or all scale factors. Thus, if any of the offsets do not have a small error variance, the offset loop closure might not happen. Similarly, if any of the scale factors do not meet the variance requirements, the scale factor closure might not succeed.

In addition, the orientation entropy (defined below) of the individual axis may be monitored in order to make sure that each axis has undergone enough diverse motions. This may be an extra precaution taken in order to avoid feedback of the calibration parameters prematurely (since P is over-optimistic, as explained below). As an example, if the phone is placed in the Z-up position, and rotated continuously for several weeks, the variance terms for all 3 axes will reach the feedback threshold. Once this happens, the current calibration estimate may be applied to the incoming accelerometer data. This may result in propagation of error via feedback, and may result in longer recovery time to calibrate. Please note, in either case, the results might not be published due to a combination or metrics used at the Decision Monitor.

The reason to apply the current estimated parameters is to avoid the large errors in the estimate due to a non-linear relationship between the measurement and the estimated KF states (offsets and scale factors).

Using Independent 3-State KF to Estimate Offsets

The KF has been designed with a new measurement that uses the difference in magnitudes of consecutive stationary segments. Using this new measurement, a 3-state KF can run in parallel to the current method and used to compute the offsets. Computing offsets instead of scale factors may be advantageous since scale factors are not observable. The advantage of using this approach is that we do not see errors due to non-linearity. Thus, these offsets may be used to benchmark the offsets estimated from the 6-state KF. In another implementation, a 3-state KF is utilized in the beginning to calibrate the offsets, followed by the 6-state KF to compute scale factors.

Passive Calibration for Initialization

Any other method that independently computes the offsets and scale factors could be used for comparison of the calibration data. For example, if we compute the offsets and scale based on monitoring the long term minima and maxima, the results from the two algorithms could be used to understand reliability the reliability of the calibration data.

Provide 'Intelligent Publishing'

In the long term, if the user behavior is not conducive to calibration convergence (i.e. the user does not actively use the phone), method of the invention can provide instructions on what kinds of motions to be performed and on which axis for convergence to expedite. This may be based on the orientation entropy of the axis.

Sensor Fault Detection

Embodiments of the invention may also implement sensor fault detection using residual monitoring and closed loop estimates. For example, if the calibration algorithm resets continuously, this may be used to identify faulty sensors III. Temperature Compensation Module In a computing device 2000, for a filter, such as the Kalman Filter (KF), the offset and scale factors for calibration of the sensors are fairly constant over time for a given temperature. However, the offset and scale factors may drift with temperature changes over a full temperature range resulting in output that may show significant variance from the actual orientation and motion associated with the computing device 2000. For example, a change in ambient temperature of 5-10 degree C. can cause errors ranging from 2.5 mg to 5 mg. Calibrating offset and scale factors over a full temperature range may substantially increase the accuracy for the sensors operating at various temperatures.

Embodiments of the invention propose creating a look-up table for storing the calibration parameters that correspond to different temperature ranges. The look-up table may be stored in the storage device 2025 in the computing device 2000. The look-up table may store the accelerometer offsets, scale factors their quality estimates and the reliability flag. A sample table is shown below.

Sample temperature look-up table

| | | | Stored | | | |
|---|---|---|---|---|---|---|
| Value Temp range (deg C.) | Offsets (mg, scalars) x y z | Scale factors (%, scalars) x y z | Error covariance matrix (6 × 6) | Reliability Flag (1 or 0) | Number of KF updates | |
| DEFAULT | | | | 1 | | |
| −20 to −10 | | | | 0 | | |
| −10 to 0 | | | | 1 | | |
| 0 to 10 | | | | 1 | | |
| 10 to 20 | | | | 0 | | |
| ... | | | | 0 | | |

The temperature of the operating environment of the motion sensor may be acquired by either a dedicated temperature sensor in the vicinity of the motion sensor or a multi-purpose temperature sensor in the vicinity of the motion sensor. It is desirable to have the temperature sensor collecting temperature data at a rate of 5 Hz or faster for better accuracy. The operating temperature range for the motion sensor, such as an accelerometer, may be obtained from the data sheets provided by the manufacturer of the sensor or determined through experimentation.

The temperature bin sizes in the table may be based on the temperature coefficients for the accelerometer offset and scale factors. In one implementation of the table, for the worst case scenario, the larger of the 2 coefficients (i.e. max (offset_temp_coefficient, scalefactor_temp_coefficient)), may be chosen as the bin size. Equal sized bins of 5 degree C. may be chosen for some sensors.

Updating Multiple Kalman Filter Parameters Using a Single Measurement

For every sensor data and temperature pair received, the temperature module may update two instances of the KF (one for each temperature bin). Updating two KF bins may be advantageous since it expedites calibration convergence. By updating two bins for each measurement, each possible sensor measurement is used to update at least the ambient temperature results and also provide faster results at the current operating temperature of the sensor. For a measurement that is at temperature T≠Tamb (where Tamb is ambient temperature), the bin at temperature T may be updated. In addition, the bin at Tamb may also be updated using the same measurement but processed with a high measurement noise. Associating a measurement noise with the measurement allows for temperature module to associate a weight with each measurement for the Kalman Filter. In each case, the measurement noise is calculated based on the distance of the current temperature from the bin center of the ambient temperature and may be represented by the following formula:

$$R_k = R_k + c^*((T - T_{amb})^* tempCo)^2$$

Thus, the default KF at Tamb may be updated with the new measurement with a high measurement noise since it is further away from the center of the current bin of T. The KF bin for T may also have a small measurement noise based on the distance between the temperature for the measurement T and the center of the current bin for temperature T. As shown in the above equation, a constant may be multiplied to account for the worst case errors due to both the offsets and the scale factors. In one implementation, the constant is 4.

Interpolation for Empty Bins

In embodiments of the invention, when the calibration is done with sufficient accuracy, the offsets and scale factors may be copied to the default temperature bin and the current temperature bin along with corresponding noise parameters described above. In one aspect, if at the time of update the table cell already contains previous calibration results, the new and old values may be weighted averaged. Ideally, it would be safe to over-write the previous calibration results, but in order to avoid skewing the results if an erroneous value is reported, the values may be averaged. For proper weighting, each table cell shall also contain the number of KF updates for this cell done over phone life time. The weight for the current KF update may then be accordingly adjusted before averaging out the value of the table cell.

The entries in the look-up table may be dynamically and continuously updated throughout the lifespan of the computing device. As the computing device 2000 is used, the table is populated and the accuracy of the data represented by the table increases. However, when the computing device is first used the look-up table may be sparsely populated. If the table cell for a current phone temperature is empty, the accelerometer offset and scale factor may be approximated. In one aspect, linear interpolation of the offsets and scale factors from nearest available cells at higher and lower temperature may be used, if both higher and lower cells are available. The corresponding variances can also be interpolated accordingly. If two or more nearest cells for the interpolation are unavailable, the variance may be increased. In one implementation, the variance is increased according to the following equation:

$$var(T) = var(T_1) + ((T_1 - T)^* temp\_coeff)^2$$

Extrapolation outside of available temperature range is not desirable because dependence on temperature may or may not be linear, and in case of non-linearity the extrapolation may result in erroneous results. The calibration accuracy is limited by the finite temperature bin size of the table. There may be a trade-off between the bin size and calibration time. If the bins are smaller (better accuracy), the calibration time becomes longer since fewer and fewer measurements are part of the same bin.

Figure 16:
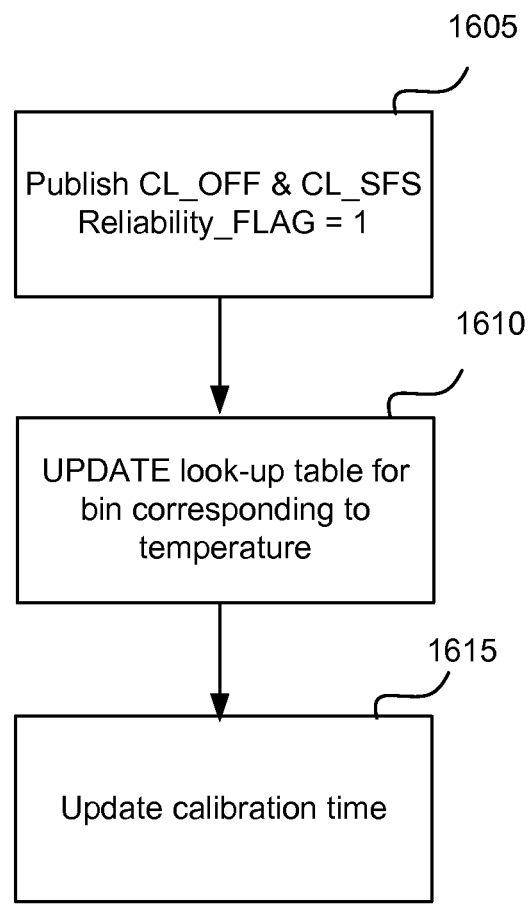
FIG. 16 is a simplified flow diagram illustrating a non-limiting method performed by the temperature compensation module of the computing device.

FIG. 16 is a simplified flow diagram illustrating a non-limiting method performed by the temperature compensation module of the computing device 2000. The process 1600 is performed by processing logic that comprises hardware (circuitry, dedicated logic, etc.), software (such as is run on a general purpose computing system or a dedicated machine), firmware (embedded software), or any combination thereof. In one embodiment, the process 1600 is performed by one or more computing devices 2000 as described in FIG. 20.

At block 1605, once the calibration module calculates the calibration offset and the calibration scale factor and the reliability flag is set the calibration data is published. At block 1610, the look-up table is updated corresponding to the current measured temperature. The process of updating the table was discussed in FIG. 15 in more detail. At block 1615, the calibration time is also updated for future use.

It should be appreciated that the specific steps illustrated in FIG. 16 provide a particular method of switching between modes of operation, according to an embodiment of the present invention. Other sequences of steps may also be performed accordingly in alternative embodiments. For example, alternative embodiments of the present invention may perform the steps outlined above in a different order. To illustrate, a user may choose to change from the third mode of operation to the first mode of operation, the fourth mode to the second mode, or any combination there between. Moreover, the individual steps illustrated in FIG. 16 may include multiple sub-steps that may be performed in various sequences as appropriate to the individual step. Furthermore, additional steps may be added or removed depending on the particular applications. One of ordinary skill in the art would recognize and appreciate many variations, modifications, and alternatives of the process.

Figure 17:
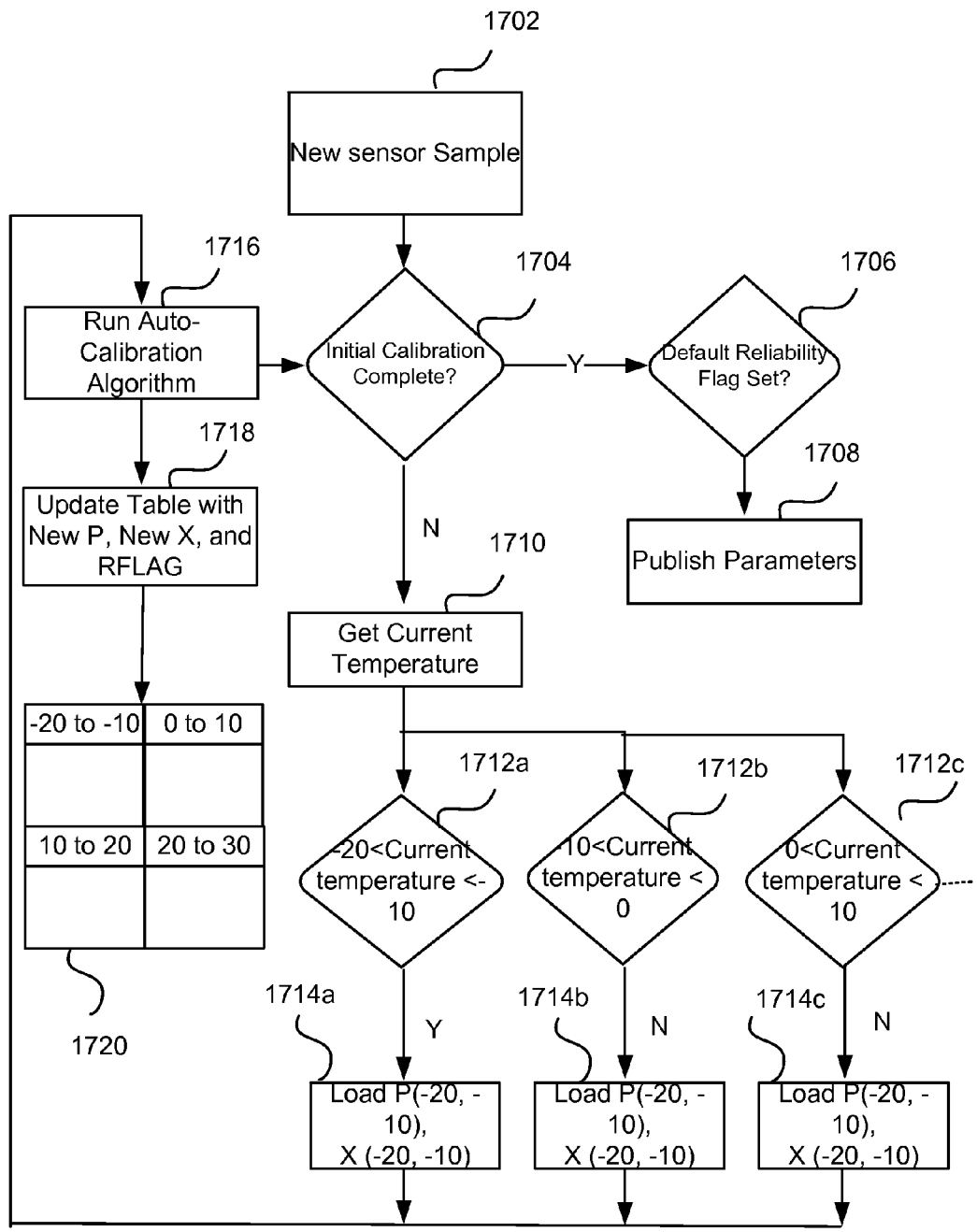
FIG. 17 is a simplified flow diagram illustrating a non-limiting method performed by the temperature compensation module of the computing device for updating the temperature compensation look-up table with sensor calibration information.

FIG. 17 is a simplified flow diagram illustrating a non-limiting method performed by the temperature compensation module of the computing device 2000 for updating the temperature compensation look-up table with sensor calibration information.

FIG. 16 is a simplified flow diagram illustrating a non-limiting method performed by the temperature compensation module of the computing device 2000. The process 1600 is performed by processing logic that comprises hardware (circuitry, dedicated logic, etc.), software (such as is run on a general purpose computing system or a dedicated machine), firmware (embedded software), or any combination thereof. In one embodiment, the process 1600 is performed by one or more computing devices 2000 as described in FIG. 20.

FIG. 17 describes a look-up table for acceleration information from an accelerometer; however, similar techniques may be used for other sensors as well. At block 1605, once the calibration module calculates the calibration offset and the calibration scale factor and the reliability flag is set the calibration data is published. At block 1610, the look-up table is updated corresponding to the current measured temperature. The process of updating the table was discussed in FIG. 15 in more detail. At block 1615, the calibration time is also updated for future use.

At block 1702, new acceleration data is received from the sensors. The calibration module may use the new acceleration to calibrate the sensors. In one implementation, at decision block 1706, if the default reliability flag is set than the results may be published (block 1708). If the initial calibration step, at 1704 is not complete than the current temperature may be sensed (block 1710). In one aspect, the current temperature is sensed using a temperature sensor that is in the vicinity of the accelerometer. In one implementation, it may be desirable that the temperature sensor provides information at a rate of 5 Hz or faster for better accuracy. Once the temperature is measured, at decision blocks 1712 [a, b, c, n], the measured temperature for the current reading may be compared against the different temperature bins. Once the temperature bin is found (as shown in 1712a and 1714a), the P and the X values are loaded. At block 1716, auto-calibration is run and the calibration is checked again (at block 1704). At block 1718 and 1720, after the auto-calibration is run, the table is updated with the new P, X and RFLAG values according to the temperature bins determined in decision block 1712. The above steps are exemplary steps for generating calibration data and specific steps may be changed or completely removed or substituted without departing from the scope of the invention.

Embodiments of the invention may also perform sophisticated temperature calibration techniques that can compute temperature coefficients during charging or ambient temperature changes and also use vendor data sheets to model temperature curve, and incorporate in the model discussed above.

In another embodiment, instead of just storing the calibration data for the temperature (or temperature bin), embodiments of the invention may store the calibration data for various orientations at each temperature (or temperature bin). And the calibration data for the temperature may be generated using the calibration data associated with the various orientations at each temperature. In some instances, interpolating calibration data for one or more orientations at a given temperature may yield better overall calibration. Interpolating the calibration data for the one or more orientations increases the entropy of the calibration data at that temperature may therefore yield better results than directly interpolating calibration data for a given temperature, as discussed in FIG. 17.

It should be appreciated that the specific steps illustrated in FIG. 17 provide a particular method of switching between modes of operation, according to an embodiment of the present invention. Other sequences of steps may also be performed accordingly in alternative embodiments. For example, alternative embodiments of the present invention may perform the steps outlined above in a different order. To illustrate, a user may choose to change from the third mode of operation to the first mode of operation, the fourth mode to the second mode, or any combination there between. Moreover, the individual steps illustrated in FIG. 17 may include multiple sub-steps that may be performed in various sequences as appropriate to the individual step. Furthermore, additional steps may be added or removed depending on the particular applications. One of ordinary skill in the art would recognize and appreciate many variations, modifications, and alternatives of the process.

Figure 18:
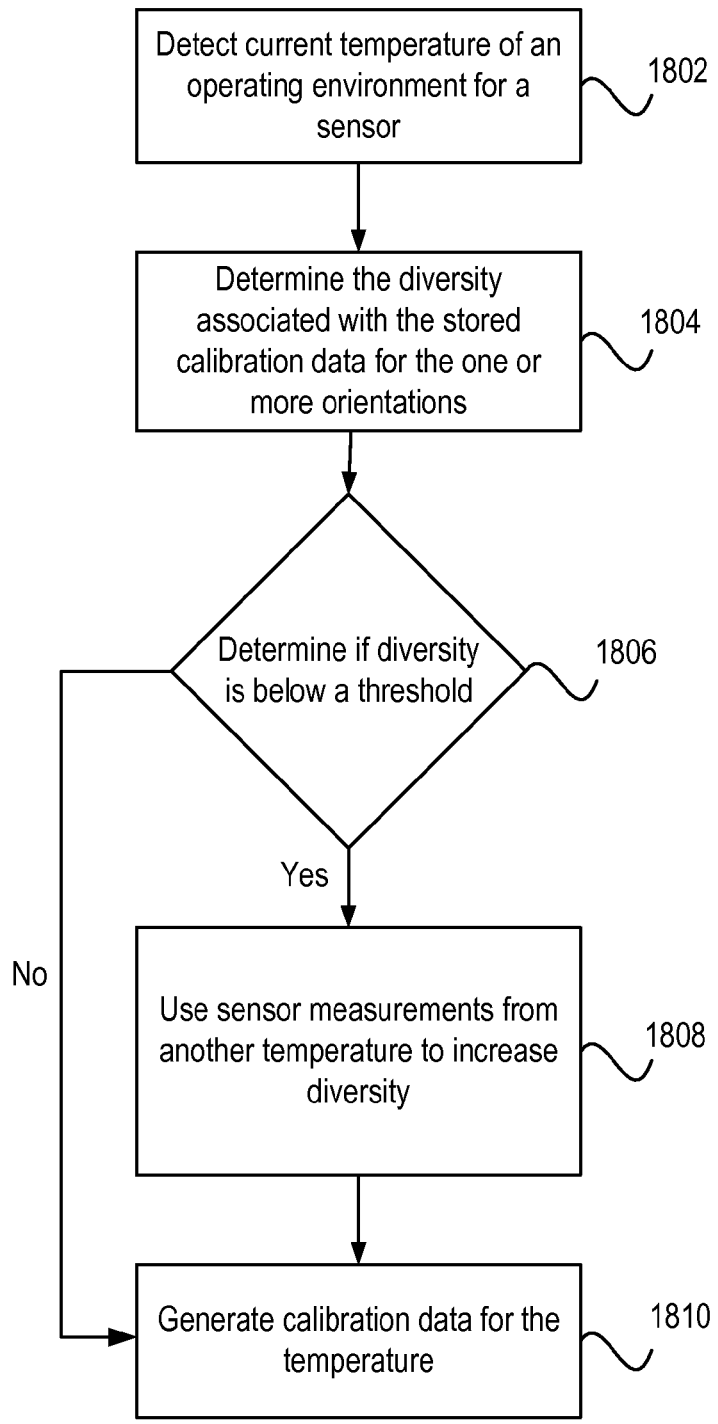
FIG. 18 is a simplified flow diagram illustrating a non-limiting method performed by the temperature compensation module of the computing device 2000 for generating calibration data for a temperature.

FIG. 18 is a simplified flow diagram illustrating a non-limiting method performed by the temperature compensation module of the computing device 2000 for generating calibration data for a temperature. Aspects discussed with respect to FIG. 16 and FIG. 17 may be combined or modified to include aspects discussed below with respect to FIG. 18. The process 1800 is performed by processing logic that comprises hardware (circuitry, dedicated logic, etc.), software (such as is run on a general purpose computing system or a dedicated machine), firmware (embedded software), or any combination thereof. In one embodiment, the process 1800 is performed by one or more computer systems 2000 as described in FIG. 20. In one embodiment, the sensors 2050 acquire the sensor input for further processing by filtering and processing by components of the device described in FIG. 20.

At block 1802, embodiments of the invention, using a temperature sensor 2070, detect the temperature of the operating environment for a sensor coupled to the computing device 2000. In one embodiment, the at least one orientation may have no sensor measurement data associated with the at least one orientation at the detected temperature. The sensor 2050 may include inertial or motion sensors, such as accelerometers 2055, gyroscopes 2060, or magnetometers 2065. For accelerometer 2055, calibration data may comprise a sensor offset and/or a sensitivity.

At block 1804, embodiments of the invention determine the entropy associated with the stored sensor measurement data at or near the detected temperature. In one embodiment, a temperature bin may be used to group the sensor measurement data at or near the detected temperature. The temperature bin may be a range of temperatures identified for combining calibration data for the one or more orientations for that range. Once the temperature is detected at block 1802, a temperature bin may be identified from a plurality of temperature bins for the sensor using the detected temperature. The processor 2010 may calculate the diversity associated with the sensor measurement data associated with the one or more orientation positions at the detected temperature. In one embodiment, the diversity of the sensor measurement data may be gauged by calculating the entropy associated with the sensor measurement data. In another embodiment, an orientation histogram may be used to determine the diversity associated with the data. However, in another embodiment, the computing device stores the pre-calculated entropy in memory 2035 for each temperature bin for quicker access.

At block 1806, embodiments of the invention determine if the diversity associated with the stored sensor measurement data for the temperature is below a threshold. The threshold may be pre-determined and static or dynamically set by components of the device. If the entropy associated with the calibration data for the various orientations is higher than the threshold, then the computing device 2000 may generate the calibration data for the temperature bin, at block 1810.

At block 1808, in response to determining that the entropy associated with the stored calibration data for the temperature is below a threshold, components of the computing device 2000 may use sensor measurement data from another temperature for increasing the diversity associated with the plurality of measurement data for the detected temperature. In one embodiment, using sensor measurement data from another temperature may include lowering the weight associated with the sensor measurement data from another temperature bin by adjusting the parameters of a filter associated with the temperature bin. In one embodiment, lowering the weight associated with the sensor measurement data from another temperature bin may include using noise with the borrowed sensor measurement data from another temperature bin.

In one embodiment, using sensor measurement data from another temperature may include linearly interpolating sensor measurement data for at least one orientation at the temperature bin for the detected temperature using the sensor measurement data from the temperature bins with higher and/or lower temperatures than the current temperature bin for the detected temperature. Linearly interpolating sensor measurement data may include using the sensor measurement data from the temperature bins with higher and/or lower temperature than the current temperature bin and a pre-determined slope of a change in sensor measurement data with respect to a change in temperature for deriving the sensor measurement data for the orientation for the identified temperature bin. The slope or the temperature coefficients may be determined by detecting time intervals when the computing device is stationary as it experiences change in temperature. In one embodiment, the determination of the slope of change in the sensor measurement data with respect to the change in the temperature may occur during the normal use of the computing device 2000, for example, while the computing device 2000, such as a phone is charging (stationary 6-10 hours). Since the orientation of the computing device 2000 does not change, the sensor offset and the temperature coefficients may be computed by the temperature compensation module by observing the change in the sensor reading per change in temperature. The ratio generated may be used as the temperature coefficient. One advantage is that such temperature compensation may not the computing device 2000 to warm-up in diverse phone orientations and simply the change in temperature while the device is in one position may be sufficient. Once the temperature coefficient has been computed, very accurate interpolation may be performed using the adjacent temperature bins. If enough temperature coefficients over a wide range of temperatures are computed, in some implementations, the calibration results at the current and nearby temperatures may be obtained simultaneously.

In addition to interpolating the sensor measurement data for an orientation, in some embodiments, the one or more processors 2010 may update the one or more orientations missing sensor measurement data at the identified temperature in memory 2035 using the interpolated or borrowed sensor measurement data.

At block 1810, embodiments of the invention, using one or more processors 2010, generate the calibration data for the sensor for the detected temperature using at least the borrowed or interpolated sensor measurement data for the detected temperature bin. In one embodiment, each temperature bin may be associated with a respective filter. In one implementation, the one or more processors 2010 may generate the calibration data for the identified temperature by updating the filter using the borrowed or interpolated sensor measurement data associated with the at least one orientation. The borrowed or interpolated sensor measurement data associated with the at least one orientation may be input to the filter with a parameter indicating lower confidence for the borrowed or interpolated sensor measurement data than other sensor measurement data from other orientations from the same temperature bin. This may have the effect of weighing the borrowed or interpolated sensor measurement data lower than the other sensor measurement data in the filter. In some embodiments, an adjustable filter such as a Kalman Filter is used in embodiments of the invention.

It should be appreciated that the specific steps illustrated in FIG. 18 provide a particular method of switching between modes of operation, according to an embodiment of the present invention. Other sequences of steps may also be performed accordingly in alternative embodiments. For example, alternative embodiments of the present invention may perform the steps outlined above in a different order. To illustrate, a user may choose to change from the third mode of operation to the first mode of operation, the fourth mode to the second mode, or any combination there between. Moreover, the individual steps illustrated in FIG. 18 may include multiple sub-steps that may be performed in various sequences as appropriate to the individual step. Furthermore, additional steps may be added or removed depending on the particular applications. One of ordinary skill in the art would recognize and appreciate many variations, modifications, and alternatives of the process.

Cross-Axis Sensitivity

Figure 19:
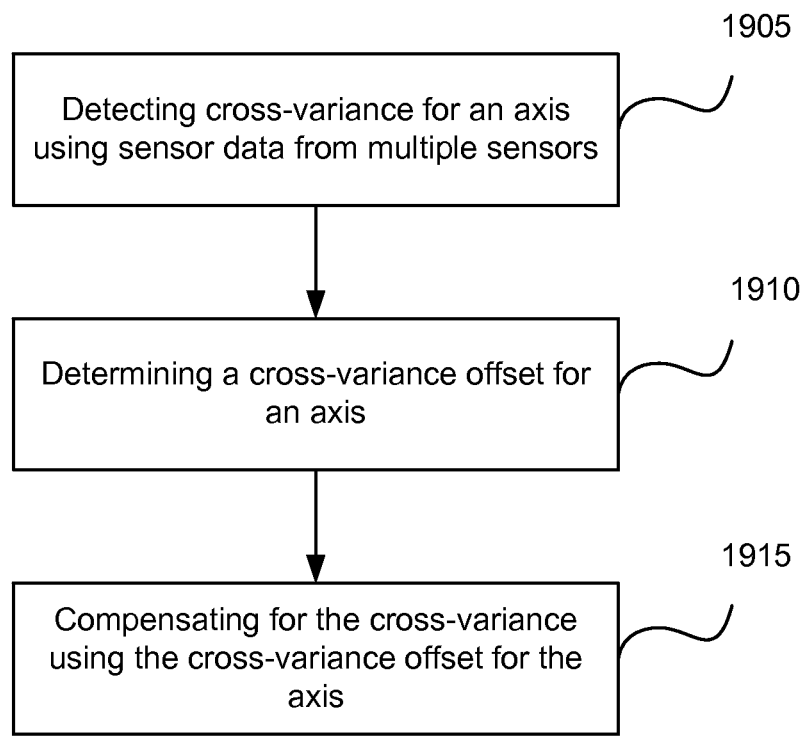
FIG. 19 illustrates an example method of compensating for cross-axis sensitivity due to manufacturing defects.

In the manufacturing process for the sensors, the sensors are calibrated to the X,Y and Z coordinate axis system, wherein the axes are relatively perpendicular to each other. However, due to manufacturing defects the axes are not always perpendicular to each other. Any variance in one axis causes cross-axis variance in all the axes in the coordinate system, since the calculations are based of the premise that the three axes are perpendicular to each other. Techniques in sensor fusion allow checking the measurements across multiple sensors and detecting the variance in the sensor calibration. Once the variance in the sensor calibration due to manufacturing defects is detected, the variance for that axes can be compensated for in the future calculations. FIG. 19 illustrates an example method of compensating for cross-axis sensitivity due to manufacturing defects. At block 1905, the computing device 2000 or modules of the computing device detect cross-variance for an axis using sensor data from multiple sensors. At block 19, a cross-variance offset is calculated for the axis using data from multiple sensors and the assumption that all axes are perpendicular to each other. At block 1915, the cross-variance offset is used in all calculations and filters to compensate for the cross-variance offset of the axis.

VI. Example Computing System

Having described multiple aspects of accelerometer auto-calibration, an example of a computing system in which various aspects of the disclosure may be implemented will now be described with respect to FIG. 20. According to one or more aspects, a computer system as illustrated in FIG. 20 may be incorporated as part of a computing device, which may implement, perform, and/or execute any and/or all of the features, methods, and/or method steps described herein. For example, computer system 2000 may represent some of the components of a hand-held device. A hand-held device may be any computing device with an input sensory unit, such as a camera and/or a display unit. Examples of a hand-held device include but are not limited to video game consoles, tablets, smart phones, and mobile devices. In one embodiment, the system 2000 is configured to implement the computing devices described in FIGS. 1 and 2. FIG. 20 provides a schematic illustration of one embodiment of a computing device 2000 that can perform the methods provided by various other embodiments, as described herein, and/or can function as the host computer system, a remote kiosk/terminal, a point-of-sale device, a mobile device, a set-top box, and/or a computer system. FIG. 20 is meant only to provide a generalized illustration of various components, any and/or all of which may be utilized as appropriate. FIG. 20, therefore, broadly illustrates how individual system elements may be implemented in a relatively separated or relatively more integrated manner.

The computer system 2000 is shown comprising hardware elements that can be electrically coupled via a bus 2005 (or may otherwise be in communication, as appropriate). The hardware elements may include one or more processors 2010, including without limitation one or more general-purpose processors and/or one or more special-purpose processors (such as digital signal processing chips, graphics acceleration processors, and/or the like); one or more input devices 2015, which can include without limitation a camera, a mouse, a keyboard and/or the like; and one or more output devices 2020, which can include without limitation a display unit, a printer and/or the like.

In addition, computing device 2000 may further include a plurality of sensors 2050, that may include but are not limited by, one or more accelerometers (e.g., accelerometer 2055), one or more gyroscopes (e.g., gyroscope 2060), and/or one or more magnetometers (e.g., magnetometer 2065), as also illustrated in FIG. 2. Accelerometer 2055 may measure and/or provide (e.g., to processor 2010) information about acceleration experienced by computing device 2000 and/or otherwise sensed by accelerometer 2055. Gyroscope 2060 may similarly measure and/or provide (e.g., to processor 2010) information about gyroscopic motion (e.g., changes in orientation) experienced by computing device 2000 and/or otherwise sensed by gyroscope 2060. In addition, magnetometer 2065 may measure and provide (e.g., to processor 2010) information regarding measurements of and/or changes in magnetic field (e.g., changes in bearing) experienced by computing device 2000 and/or otherwise sensed by magnetometer 2065. In some embodiments, filters may be implemented in one or more of the sensors discussed above, or implemented as separate hardware or software components, for example as stored in the operating system 2040, application 2045, or other portion of the working memory 2035 or the storage device 2025.

The computer system 2000 may further include (and/or be in communication with) one or more non-transitory storage devices 2025, which can comprise, without limitation, local and/or network accessible storage, and/or can include, without limitation, a disk drive, a drive array, an optical storage device, a solid-state storage device such as a random access memory ("RAM") and/or a read-only memory ("ROM"), which can be programmable, flash-updateable and/or the like. Such storage devices may be configured to implement any appropriate data storage, including without limitation, various file systems, database structures, and/or the like.

The computer system 2000 might also include a communications subsystem 2030, which can include without limitation a modem, a network card (wireless or wired), an infrared communication device, a wireless communication device and/or chipset (such as a Bluetooth® device, an 802.11 device, a WiFi device, a WiMax device, cellular communication facilities, etc.), and/or the like. The communications subsystem 2030 may permit data to be exchanged with a network (such as the network described below, to name one example), other computer systems, and/or any other devices described herein. In many embodiments, the computer system 2000 will further comprise a non-transitory working memory 2035, which can include a RAM or ROM device, as described above.

The computer system 2000 also can comprise software elements, shown as being currently located within the working memory 2035, including an operating system 2040, device drivers, executable libraries, and/or other code, such as one or more application programs 2045, which may comprise computer programs provided by various embodiments, and/or may be designed to implement methods, and/or configure systems, provided by other embodiments, as described herein. Merely by way of example, one or more modules (e.g., scheduling, calibration and temperature modules) described with respect to the method(s) discussed above, for example as described with respect to FIG. 4 and other figures, might be implemented as code and/or instructions executable by a computer (and/or a processor within a computer); in an aspect, then, such code and/or instructions can be used to configure and/or adapt a general purpose computer (or other device) to perform one or more operations in accordance with the described methods.

As noted above, in one or more embodiments, the system 2000 may be configured to implement the computing device of FIG. 1 and FIG. 2 discussed previously. In these embodiments, hardware components described above with respect to FIG. 1 and FIG. 2 may correspond to similar components described here with respect to system 2000. Additionally or alternatively, components described above with respect to FIG. 1 and FIG. 2 that might not be described here with respect to system 2000 may be added to and/or otherwise incorporated with system 2000 (e.g., in a manner similar to how such components may be included in FIG. 1 and FIG. 2).

A set of these instructions and/or code might be stored on a computer-readable storage medium, such as the storage device(s) 2025 described above. In some cases, the storage medium might be incorporated within a computer system, such as computer system 2000. In other embodiments, the storage medium might be separate from a computer system (e.g., a removable medium, such as a compact disc), and/or provided in an installation package, such that the storage medium can be used to program, configure and/or adapt a general purpose computer with the instructions/code stored thereon. These instructions might take the form of executable code, which is executable by the computer system 2000 and/or might take the form of source and/or installable code, which, upon compilation and/or installation on the computer system 2000 (e.g., using any of a variety of generally available compilers, installation programs, compression/decompression utilities, etc.) then takes the form of executable code.

Substantial variations may be made in accordance with specific requirements. For example, customized hardware might also be used, and/or particular elements might be implemented in hardware, software (including portable software, such as applets, etc.), or both. Further, connection to other computing devices such as network input/output devices may be employed.

Some embodiments may employ a computer system (such as the computer system 2000) to perform methods in accordance with the disclosure. For example, some or all of the procedures of the described methods may be performed by the computer system 2000 in response to processor 2010 executing one or more sequences of one or more instructions (which might be incorporated into the operating system 2040 and/or other code, such as an application program 2045) contained in the working memory 2035. Such instructions may be read into the working memory 2035 from another computer-readable medium, such as one or more of the storage device(s) 2025. Merely by way of example, execution of the sequences of instructions contained in the working memory 2035 might cause the processor(s) 2010 to perform one or more procedures of the methods described herein, for example a method associated with the modules described with respect to FIG. 4.

The terms "machine-readable medium" and "computer-readable medium," as used herein, refer to any medium that participates in providing data that causes a machine to operate in a specific fashion. In an embodiment implemented using the computer system 2000, various computer-readable media might be involved in providing instructions/code to processor(s) 2010 for execution and/or might be used to store and/or carry such instructions/code (e.g., as signals). In many implementations, a computer-readable medium is a physical and/or tangible storage medium. Such a medium may take many forms, including but not limited to, non-volatile media, volatile media, and transmission media. Non-volatile media include, for example, optical and/or magnetic disks, such as the storage device(s) 2025. Volatile media include, without limitation, dynamic memory, such as the working memory 2035. Transmission media include, without limitation, coaxial cables, copper wire and fiber optics, including the wires that comprise the bus 2005, as well as the various components of the communications subsystem 2030 (and/or the media by which the communications subsystem 2030 provides communication with other devices). Hence, transmission media can also take the form of waves (including without limitation radio, acoustic and/or light waves, such as those generated during radio-wave and infrared data communications).

Common forms of physical and/or tangible computer-readable media include, for example, a floppy disk, a flexible disk, hard disk, magnetic tape, or any other magnetic medium, a CD-ROM, any other optical medium, punchcards, papertape, any other physical medium with patterns of holes, a RAM, a PROM, EPROM, a FLASH-EPROM, any other memory chip or cartridge, a carrier wave as described hereinafter, or any other medium from which a computer can read instructions and/or code.

Various forms of computer-readable media may be involved in carrying one or more sequences of one or more instructions to the processor(s) 2010 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 2000. These signals, which might be in the form of electromagnetic signals, acoustic signals, optical signals and/or the like, are all examples of carrier waves on which instructions can be encoded, in accordance with various embodiments of the invention.

The communications subsystem 2030 (and/or components thereof) generally will receive the signals, and the bus 2005 then might carry the signals (and/or the data, instructions, etc. carried by the signals) to the working memory 2035, from which the processor(s) 2010 retrieves and executes the instructions. The instructions received by the working memory 2035 may optionally be stored on a non-transitory storage device 2025 either before or after execution by the processor(s) 2010.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, algorithms, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Also, some embodiments were described as processes depicted as flow diagrams or block diagrams. Although each may describe the operations as a sequential process, many of the operations can be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

Having described several embodiments, various modifications, alternative constructions, and equivalents may be used without departing from the spirit of the disclosure. For example, the above elements may merely be a component of a larger system, wherein other rules may take precedence over or otherwise modify the application of the invention. Also, a number of steps may be undertaken before, during, or after the above elements are considered. Accordingly, the above description does not limit the scope of the disclosure.

What is claimed is:

1. A method comprising:
   determining, via a device, whether a power level associated with the device is above a threshold or that a battery associated with the device is charging;
   in response to determining whether the power level is above the threshold or that the battery is charging:
      receiving, via the device, a plurality of calibration measurements associated with one or more sensors of the device;
      determining, via the device, a degree of variance to which the plurality of calibration measurements were obtained at different orientations of the device; and
      determining, via the device, based on the determined degree of variance, whether to update one or more calibration parameters, wherein the calibration parameters are used to calibrate the one or more sensors of the device.

2. The method of claim 1, wherein:
   determining the degree to which the plurality of calibration measurements were obtained at different orientations comprises calculating an orientation entropy for the plurality of calibration measurements.

3. The method of claim 2, further comprising:
   in response to determining that the orientation entropy exceeds a predetermined threshold, updating the one or more calibration parameters.

4. The method of claim 2, further comprising:
   in response to determining that the orientation entropy is below a predetermined threshold, discarding a calibration measurement from the plurality of calibration measurements, wherein the calibration measurement was obtained for an orientation for which a calibration measurement has been previously received without updating the one or more calibration parameters.

5. The method of claim 2, further comprising:
   in response to determining that the orientation entropy is below a predetermined threshold, using a calibration measurement for an orientation for which a calibration measurement has been previously received without updating the one or more calibration parameters.

6. The method of claim 1, wherein:
   determining the degree to which the plurality of calibration measurements were obtained at different orientations is based at least in part on a histogram for the plurality of calibration measurements.

7. The method of claim 1, wherein determining the degree of variance to which the plurality of calibration measurements were obtained at different orientations comprises binning each of the plurality of calibration measurements into at least one orientation bin of a plurality of orientation bins and determining diversity of the plurality of orientation bins that include calibration measurements.

8. The method of claim 7, wherein each orientation bin of the plurality of orientation bins corresponds to orientation measurements obtained within a five-degree increment.

9. The method of claim 1, wherein determining the degree comprises determining a range or variance of orientations at which the plurality of calibration measurements were obtained.

10. The method of claim 1, wherein the one or more calibration parameters are inputs to a filter and are updated at the filter to generate calibration results.

11. The method of claim 10, wherein the filter is a Kalman filter.

12. The method of claim 1, wherein the sensor is one or more of an accelerometer, a gyroscope or a magnetometer.

13. A device, comprising a calibration module configured to:
   determine whether a power level associated with the device is above a threshold or that a battery associated with the device is charging;
   in response to determining whether the power level is above the threshold or that the battery is charging:
      receive a plurality of calibration measurements associated with one or more sensors of a device;
      determine a degree of variance to which the plurality of calibration measurements were obtained at different orientations of the device; and
      determine, based on the determined degree of variance, whether to update one or more calibration parameters, wherein the calibration parameters are used to calibrate the one or more sensors of the device.

14. The device of claim 13, wherein:
   determining the degree to which the plurality of calibration measurements were obtained at different orientations comprises calculating, by the calibration module, an orientation entropy for the plurality of calibration measurements.

15. The device of claim 14, wherein the calibration module is further configured to:
   update the one or more calibration parameters in response to determining that the orientation entropy exceeds a predetermined threshold.

16. The device of claim 14, wherein the calibration module is further configured to:
  discard a calibration measurement from the plurality of calibration measurements, wherein the calibration measurement was obtained for an orientation for which a previous calibration measurement has been previously received without updating the one or more calibration parameters, in response to determining that the orientation entropy is below a predetermined threshold.

17. The device of claim 14, wherein the calibration module is further configured to:
  use a calibration measurement for an orientation for which a previous calibration measurement has been previously received without updating the one or more calibration parameters, in response to determining that the orientation entropy is below a predetermined threshold.

18. The device of claim 13, wherein:
  determining the degree to which the plurality of calibration measurements were obtained at different orientations is based at least in part on a histogram for the plurality of calibration measurements.

19. The device of claim 13, wherein determining the degree of variance to which the plurality of calibration measurements were obtained at different orientations comprises the calibration module configured to bin each of the plurality of calibration measurements into at least one orientation bin of a plurality of orientation bins and determine diversity of the plurality of orientation bins that include calibration measurements.

20. The device of claim 19, wherein each orientation bin of the plurality of orientation bins corresponds to orientation measurements obtained within a five-degree increment.

21. The device of claim 13, wherein determining the degree of variance comprises the calibration module configured to determine a range or variance of orientations at which the plurality of calibration measurements were obtained.

22. The device of claim 13, wherein the one or more calibration parameters are inputs to a filter and are updated at the filter to generate calibration results.

23. The device of claim 22, wherein the filter is a Kalman filter.

24. The device of claim 13, wherein the sensor is one or more of an accelerometer, a gyroscope or a magnetometer.

25. A non-transitory computer readable storage medium, wherein the non-transitory computer readable storage medium comprises instructions executable by a processor, the instructions comprising instructions to:
  determine whether a power level associated with the device is above a threshold or that a battery associated with the device is charging;
  in response to determining whether the power level is above the threshold or that the battery is charging:
    receive a plurality of calibration measurements associated with one or more sensors of a device;
    determine a degree of variance to which the plurality of calibration measurements were obtained at different orientations of the device; and
    determine, based on the determined degree of variance, whether to update one or more calibration parameters, wherein the calibration parameters are used to calibrate the one or more sensors of the device.

26. A apparatus comprising:
  means for determining whether a power level associated with the device is above a threshold or that a battery associated with the device is charging;
  in response to determining whether the power level is above the threshold or that the battery is charging:
    means for receiving a plurality of calibration measurements associated with one or more sensors of a device;
    means for determining a degree of variance to which the plurality of calibration measurements were obtained at different orientations of the device; and
    means for determining, based on the determined degree of variance, whether to update one or more calibration parameters, wherein the calibration parameters are used to calibrate the one or more sensors of the device.

27. The apparatus of claim 26, wherein determining the degree of variance to which the plurality of calibration measurements were obtained at different orientations comprises:
  means for calculating an orientation entropy for the plurality of calibration measurements; and
  means for updating the one or more calibration parameters, in response to determining that the orientation entropy exceeds a predetermined threshold.

28. The apparatus of claim 26, wherein:
  determining the degree of variance to which the plurality of calibration measurements were obtained at different orientations is based at least in part on a histogram for the plurality of calibration measurements.

29. The apparatus of claim 26, wherein determining the degree of variance to which the plurality of calibration measurements were obtained at different orientations comprises means for binning each of the plurality of calibration measurements into at least one orientation bin of a plurality of orientation bins and means for determining diversity of the plurality of orientation bins that include calibration measurements.

30. The apparatus of claim 26, wherein determining the degree of variance comprises means for determining a range or variance of orientations at which the plurality of calibration measurements were obtained.

31. The apparatus of claim 26, wherein the one or more calibration parameters are inputs to a filter and are updated at the filter to generate calibration results.

* * * * *